(12) United States Patent
Du et al.

(10) Patent No.: US 11,804,178 B2
(45) Date of Patent: Oct. 31, 2023

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Lili Du, Beijing (CN); Hongjun Zhou, Beijing (CN); Wen Tan, Beijing (CN); Cong Liu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 148 days.

(21) Appl. No.: 17/434,467

(22) PCT Filed: Sep. 21, 2020

(86) PCT No.: PCT/CN2020/116429
§ 371 (c)(1),
(2) Date: Aug. 27, 2021

(87) PCT Pub. No.: WO2022/056901
PCT Pub. Date: Mar. 24, 2022

(65) Prior Publication Data
US 2022/0343843 A1   Oct. 27, 2022

(51) Int. Cl.
G09G 3/3233   (2016.01)
G09G 3/00   (2006.01)
(Continued)

(52) U.S. Cl.
CPC .......... G09G 3/3233 (2013.01); G09G 3/006 (2013.01); G09G 3/3266 (2013.01);
(Continued)

(58) Field of Classification Search
CPC .... G09G 3/3233; G09G 3/006; G09G 3/3266; G09G 2300/0408; G09G 2300/0426;
(Continued)

(56) References Cited

U.S. PATENT DOCUMENTS 10,157,565 B2   12/2018   Shin et al.
11,393,893 B2 *  7/2022   Jo ........................ H10K 59/131

FOREIGN PATENT DOCUMENTS

CN   103412216 A   11/2013
CN   103871342 A   6/2014
(Continued)

*Primary Examiner* — Kenneth B Lee, Jr.
(74) *Attorney, Agent, or Firm* — HOUTTEMAN LAW LLC

(57) ABSTRACT

A display substrate of the present disclosure includes a display region including sub-pixels, data lines, and gate lines; and a circuit region including a first sub-region and a second sub-region opposite to each other at two sides of the display region along a first direction. The first sub-region is provided with a plurality of multiplexing unit groups, each of which includes at least one multiplexing unit. The second sub-region is provided with a plurality of testing unit groups, each of which includes at least one testing unit. The circuit region is further provided with a plurality of driving unit groups, each of which includes at least one driving unit. The driving unit groups and the multiplexing unit groups are alternately arranged along an extending direction of the first sub-region in the first sub-region.

20 Claims, 13 Drawing Sheets

(51) Int. Cl.
  *G09G 3/3266* (2016.01)
  *H10K 59/131* (2023.01)
(52) U.S. Cl.
  CPC ... *H10K 59/131* (2023.02); *G09G 2300/0408* (2013.01); *G09G 2300/0426* (2013.01); *G09G 2300/0452* (2013.01); *G09G 2300/0819* (2013.01); *G09G 2300/0842* (2013.01); *G09G 2310/0286* (2013.01); *G09G 2310/0297* (2013.01); *G09G 2310/061* (2013.01); *G09G 2320/0626* (2013.01); *G09G 2330/021* (2013.01); *G09G 2330/12* (2013.01)
(58) Field of Classification Search
  CPC ... G09G 2300/0819; G09G 2300/0842; G09G 2310/0286; G09G 2310/061; G09G 2310/0297; G09G 2320/0626; H10K 59/131
  See application file for complete search history.

(56) References Cited

FOREIGN PATENT DOCUMENTS

| | | | | |
|---|---|---|---|---|
| CN | 105895002 A | | 8/2016 | |
| CN | 107505789 A | | 12/2017 | |
| CN | 109285493 A | | 1/2019 | |
| CN | 111599847 A | * | 8/2020 | ......... H01L 27/0248 |
| CN | 111599847 A | | 8/2020 | |

* cited by examiner

DISPLAY SUBSTRATE AND DISPLAY DEVICE

TECHNICAL FIELD

The present disclosure relates to the field of display technology, and in particular to a display substrate and a display device.

BACKGROUND

Organic Light Emitting Diode (OLED) display technology has been widely applied in the fields of a television, a smart phone, a wearable display device, a Virtual Reality (VR) display, an automotive display, and the like, due to advantages of lightness and thinness, flexibility, excellent shock resistance, fast response speed, and the like.

With the development of technology, a large "screen-to-body ratio (i.e., a ratio of an area of an actual display region to a total area of the display side)" has become one of appearance characteristics sought in the display device. In particular, for a wearable display device, such as a smart watch, an extremely narrow-bezel and even full-screen display is becoming an important development trend for portability, visual effect, and the like.

In the related art, some driving circuits for sub-pixels may be provided directly outside a display region of a display substrate. Obviously, the region where the driving circuits are located cannot be directly used to perform a display, and thus corresponds to a "bezel" of a display device.

SUMMARY

The present disclosure provides a display substrate and a display device.

In a first aspect, the present disclosure provides a display substrate including a display region and a peripheral region, the peripheral region including a capacitor region, a circuit region, a fan-out region and a joint region, wherein the display region is provided with: a plurality of sub-pixels; a plurality of data lines extending along a first direction, each of the plurality of data lines being coupled to multiple sub-pixels; and a plurality of gate lines extending in a second direction intersecting the first direction, each of the plurality of gate lines being coupled to multiple sub-pixels, the circuit region is provided with a first sub-region and a second sub-region which are opposite to each other at two sides of the display region along the first direction, respectively, the first sub-region is provided with a plurality of multiplexing unit groups configured to provide data signals to the plurality of data lines, and each of the multiplexing unit groups includes at least one multiplexing unit; the second sub-region is provided with a plurality of testing unit groups configured to provide testing signals to the plurality of data lines, and each of the plurality of testing unit groups includes at least one testing unit; the circuit region is further provided with a plurality of driving unit groups, each of the driving unit groups includes at least one driving unit; the driving unit groups and the multiplexing unit groups are alternately arranged in the first sub-region along an extending direction of the first sub-region, and the driving unit groups and the testing unit groups are alternately arranged in the second sub-region along an extending direction of the second sub-region; the capacitor region is between the second sub-region and the display region, and is provided with a plurality of compensation capacitor units, and each of the plurality of compensation capacitor units is coupled to one of the plurality of data lines, the joint region is on a side of the first sub-region distal to the display region and includes a plurality of joints, at least some of the plurality of joints are coupled to signal lines, the signal lines include multiplexing signal lines coupled to multiplexing units, testing signal lines coupled to testing units and driving signal lines coupled to driving units; and the fan-out region is between the joint region and the first sub-region, and is provided with the multiplexing signal lines.

In some embodiments, the first sub-region includes a first arc region, the second sub-region includes a second arc region, and an edge of the first arc region proximal to the display region is closer to a center of the display region than an edge of the second arc region proximal to the display region.

In some embodiments, the first arc region has a same circle center as the second arc region, and a radius of the edge of the first arc region proximal to the display region is smaller than a radius of the edge of the second arc region proximal to the display region by 210 μm~420 μm.

In some embodiments, in the first sub-region, the multiplexing unit groups include first multiplexing unit groups and second multiplexing unit groups, each of the first multiplexing unit groups includes M multiplexing units, each of the second multiplexing unit groups includes N multiplexing units, N and M are integers each greater than 1, and M<N, the second multiplexing unit groups are in the middle of the first sub-region, the first multiplexing unit groups are at two ends of the first sub-region distal to the middle of the first sub-region; and/or in the second sub-region, the testing unit groups include first testing unit groups and second testing unit groups, each of the first testing unit groups includes K testing units, each of the second testing unit groups includes L testing units, L and K are integers each greater than 1, and K<L, the second testing unit groups are in the middle of the second sub-region, and the first testing unit groups are at two ends of the second sub-region distal to the middle of the second sub-region.

In some embodiments, the circuit region is divided into a first half region and a second half region which are opposite to each other at two sides of the display region along the second direction;

the driving units include a plurality of gate driving units; and the first half region is provided with multiple gate driving units configured to provide a gate driving signal to the plurality of gate lines.

In some embodiments, the display region is further provided with a plurality of control electrode lines extending along the second direction, and each of the plurality of control electrode line is coupled to multiple sub-pixels;

the driving units further include a plurality of control electrode driving units; and the second half region is provided with a plurality of control electrode driving units configured to provide a control electrode driving signal to the plurality of control electrode lines.

In some embodiments, the multiplexing signal lines include a plurality of multiplexing control lines and a plurality of multiplexing data lines;

at least one of the multiplexing units includes a plurality of multiplexing transistors; a gate of each of the plurality of multiplexing transistors is coupled to one of the multiplexing control lines, a first electrode of each of the multiplexing transistors is coupled to one of the data lines, and a second electrode of each of the multiplexing transistors is coupled to one of the multiplexing data lines; and second electrodes of all multiplexing transistors in a same multiplexing unit are coupled to a same multiplexing data line, and second electrodes of the multiplexing transistors in different multiplexing units are coupled to different multiplexing data lines.

In some embodiments, the testing signal lines include testing control lines and testing data lines;

at least one of the testing units includes a plurality of testing transistors; a gate of each of the plurality of testing transistors is coupled to one of the testing control lines, a first electrode of each of the plurality of testing transistors is coupled to one of the data lines, and a second electrode of each of the plurality of testing transistors is coupled to one of the testing data line; and each of the testing data lines is coupled to multiple testing units.

In some embodiments, the testing signal lines are on a side of the circuit region distal to the display region; and the driving signal lines are on a side of the circuit region distal to the display region.

In some embodiments, ends of the first sub-region closest to the second sub-region are closer to the display region than ends of the second sub-region closest to the first sub-region.

In some embodiments, the circuit region further includes:

connection sub-regions which are between and coupled to the ends of the first sub-region closest to the second sub-region and the ends of the second sub-region closest to the first sub-region.

In some embodiments, the display substrate further includes at least one polysilicon resistor, wherein each of the at least one polysilicon resistor is between and coupled to two of the signal lines, the polysilicon resistor is on a side of the end of the first sub-region closest to the second sub-region, distal to the display region, or the polysilicon resistor is on a side of the connection sub-region distal to the display region.

In some embodiments, the testing signal lines are on a side of the circuit region distal to the display region;

the driving signal lines are on a side of the circuit region distal to the display region; and the polysilicon resistor is on a side of the testing signal lines and the driving signal lines distal to the display region.

In some embodiments, the display substrate further includes at least one electrostatic discharge unit, wherein each of the at least one electrostatic discharge unit is coupled to one of the signal lines and configured to release static charges in the signal line to which it is coupled; the electrostatic discharge unit is on a side of the end of the first sub-region closest to the second sub-region, distal to the display region, or the electrostatic discharge unit is on a side of the connection sub-region distal to the display region.

In some embodiments, the testing signal lines are on a side of the circuit region distal to the display region;

the driving signal lines are on a side of the circuit region distal to the display region; and the electrostatic discharge units are on a side of the testing signal lines and the driving signal lines distal to the display region.

In some embodiments, the multiplexing signal lines include a plurality of multiplexing control lines and a plurality of multiplexing data lines; and the signal lines coupled to each of electrostatic discharge units are the testing signal lines or the multiplexing control lines.

In some embodiments, the driving signal lines include a high level line and a low level line, the high level line is coupled to a high level signal source, and the low level line is coupled to a low level signal source; and each of the electrostatic discharge units includes a first discharge transistor and a second discharge transistor; a gate and a first electrode of the first discharge transistor are coupled to the high level line, and a second electrode of the first discharge transistor is coupled to the signal line corresponding to the electrostatic discharge unit; and a gate and a first electrode of the second discharge transistor are coupled to the signal line corresponding to the electrostatic discharge unit, and a second electrode of the second discharge transistor is coupled to the low level line.

In some embodiments, at least some of different data lines are coupled to different numbers of sub-pixels; and except for the data line coupled to a largest number of sub-pixels, each of the remaining data lines is coupled to one of the compensation capacitor units.

In some embodiments, each of the compensation capacitor units includes one or more compensation capacitors;

except for the data line coupled to the largest number of sub-pixels, the number n of the compensation capacitors in the compensation capacitor unit coupled to each of the remaining data lines, satisfies:

$N = N_{max} - N;$ wherein Nmax is the number of the sub-pixels coupled to the data line coupled to the largest number of the sub-pixels, and N is the number of the sub-pixels coupled to the data line coupled to the compensation capacitor unit.

In some embodiments, the data line is coupled to first electrodes of all the compensation capacitors in the compensation capacitor unit coupled to the data line; and second electrodes of all the compensation capacitors in the compensation capacitor unit are coupled to a same constant level signal line.

In some embodiments, multiple sub-pixels coupled to each of the data lines are arranged in a column along the first direction; and the compensation capacitor unit coupled to each of the data lines is between a column of sub-pixels coupled to the data line and the second sub-region along the first direction.

In some embodiments, the display substrate is an organic light emitting diode display substrate.

The present disclosure further provides a display device, including the display substrate in any one of the above mentioned embodiments.

In some embodiments, the display device is a wearable display device.

BRIEF DESCRIPTION OF THE DRAWINGS

The drawings are intended to provide a further understanding of the embodiments of the present disclosure, and constitute a part of the specification. The drawings together with the embodiments of the present disclosure are used for explaining the present disclosure, but not intended to limit the present disclosure. The above and other features and advantages will become more apparent to those skilled in the art by describing in detail exemplary embodiments thereof with reference to the drawings, in which.

Figure 1:
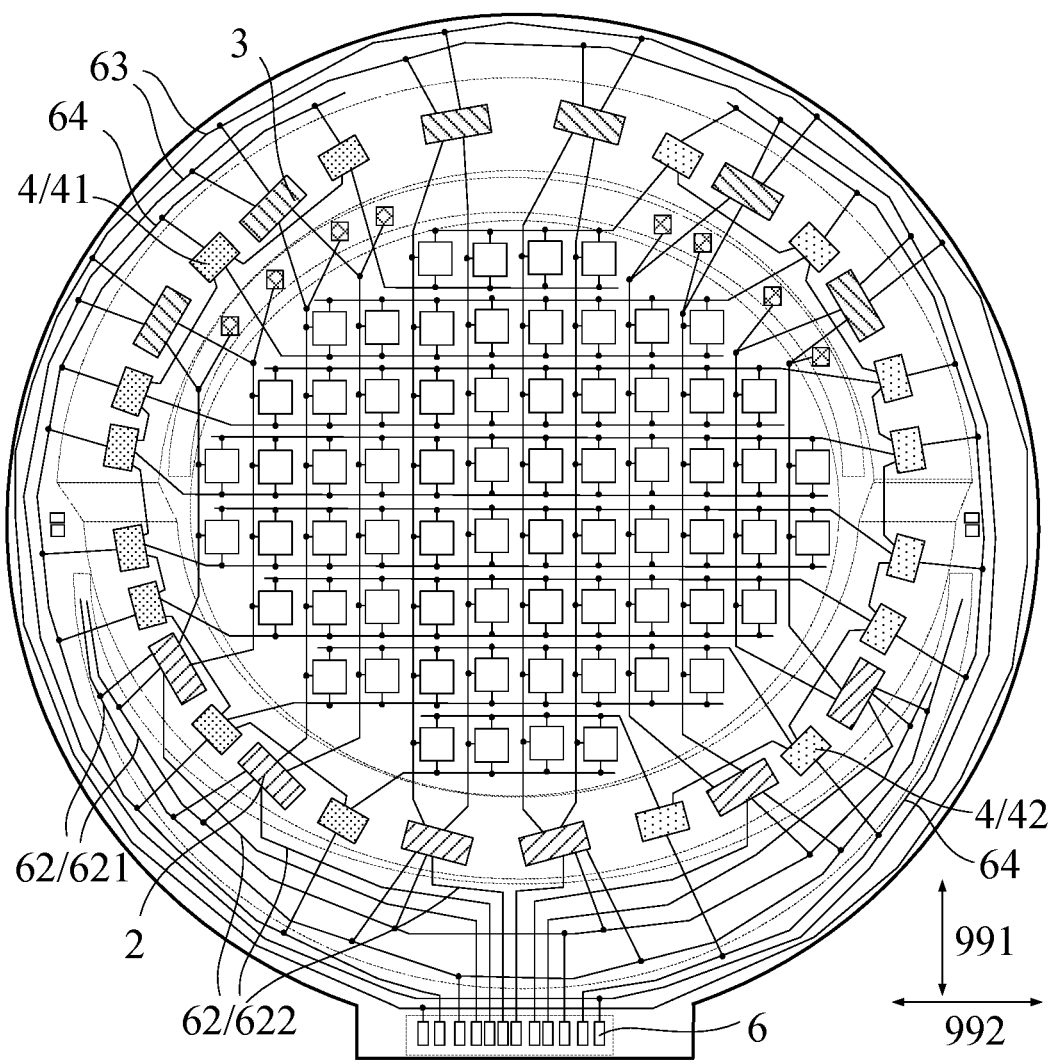
FIG. 1 is a schematic diagram illustrating a structure of a display substrate according to an embodiment of the present disclosure.

In the drawings of the embodiments of the present disclosure, the reference numerals are as below:

1: sub-pixel; 11: data line; 12: gate line; 13: control electrode line; 19: anode signal line;

2: multiplexing unit; 21: multiplexing transistor;

3: testing unit; 31: testing transistor; 311: first testing transistor; 312: second testing transistor; 313: third testing transistor; 314: fourth testing transistor; 315: fifth testing transistor;

4: driving unit; 41: gate driving unit; 42: control electrode driving unit;

5: compensation capacitor unit; 51: compensation capacitor;

6: joint; 62: multiplexing signal line; 621: multiplexing control line; 622: multiplexing data line; 63: testing signal line; 631: testing control line; 6311: first testing control line; 6312: second testing control line; 6313: third testing control line; 632: testing data line; 6321: first testing data line; 6322: second testing data line; 6323: third testing data line;

64: driving signal line; 641: high level line; 642: low level line;

71: polysilicon resistor; 711: first polysilicon resistor; 712: second polysilicon resistor; 72: electrostatic discharge unit; 721: first discharge transistor; 722: second discharge transistor;

91: display region; 92: circuit region; 921: first sub-region; 922: second sub-region; 923: connection sub-region; 93: fan-out region; 94: joint region; 95: capacitor region; 991: first direction; 992: second direction;

T1: first transistor; T2: second transistor; T3: third transistor; T4: fourth transistor; T5: fifth transistor; T6: sixth transistor; T7: seventh transistor; Cst: storage capacitor; Reset: first reset terminal; Reset': second reset terminal; Vinit: initializing terminal; Gate: gate line terminal; Data: data line terminal; EM: control electrode line terminal; VDD: anode signal terminal; VSS: cathode signal terminal;

K1: first gate transistor; K2: second gate transistor; K3: third gate transistor; K4: fourth gate transistor; K5: fifth gate transistor; K6: sixth gate transistor; K7: seventh gate transistor; K8: eighth gate transistor; C1: first gate capacitor; C2: second gate capacitor; N1: first gate node; N2: second gate node; N3: third gate node;

M1: first control electrode transistor; M2: second control electrode transistor; M3: third control electrode transistor; M4: fourth control electrode transistor; M5: fifth control electrode transistor; M6: sixth control electrode transistor; M7: seventh control electrode transistor; M8: eighth control electrode transistor; M9: ninth control electrode transistor; M10: tenth control electrode transistor; C1': first control electrode capacitor; C2': second control electrode capacitor; C3': third control electrode capacitor; N1': first control electrode node; N2': second control electrode node; N3': third control electrode node; N4': fourth control electrode node.

DETAILED DESCRIPTION

In order to make those skilled in the art better understand the technical solutions of the embodiments of the present disclosure, a display substrate and a display device in the embodiments of the present disclosure will be described in detail below with reference to the accompanying drawings.

The embodiments of the present disclosure will be described more fully hereinafter with reference to the accompanying drawings, but the embodiments shown may be embodied in different forms and should not be construed as limited to the embodiments set forth herein. On the contrary, the purpose of providing these embodiments is to make the present disclosure thorough and complete, and to enable those skilled in the art to fully understand the scope of the present disclosure.

The embodiments of the present disclosure may be described with reference to plan and/or cross-sectional views by way of idealized schematic illustrations of the present disclosure. Accordingly, the example drawings may be modified in accordance with manufacturing techniques and/or tolerances.

The embodiments of the present disclosure and features of the embodiments may be combined with each other without conflict.

The terminology used in the present disclosure is for the purpose of describing particular embodiments only and is not intended to limit the present disclosure. As used in the present disclosure, the term "and/or" includes any and all combinations of one or more of the associated listed items. As used in the present disclosure, the singular forms "a (an)" and "the" are intended to include the plural forms as well, unless the context clearly indicates otherwise. As used in the present disclosure, the terms "comprising (including)", "consisting of", specify the presence of features, integers, steps, operations, elements, and/or components, but do not preclude the presence or addition of one or more other features, integers, steps, operations, elements, components, and/or groups thereof.

Unless otherwise defined, all terms (including technical and scientific terms) used in the present disclosure have the same meaning as commonly understood by those skilled in the art. It will be further understood that the terms, such as those defined in commonly used dictionaries, should be interpreted as having meanings that are consistent with their meanings in the context of the related art and the present disclosure, and will not be interpreted in an idealized or overly formal sense unless expressly so defined herein.

The embodiments of the present disclosure are not limited to the embodiments shown in the drawings, but include modifications of configurations formed based on manufacturing processes. Thus, the regions illustrated in the drawings have schematic properties, and the shapes of the regions shown in the drawings illustrate specific shapes of regions of elements, but are not intended to be restrictive.

In the embodiments of the present disclosure, in the drawings, a size of a component, a thickness of a layer, or a region may be exaggerated for clarity. Therefore, one implementation of the present disclosure is not necessarily limited to the size, and the shape and size of the component in the drawings do not reflect a true scale. Further, the drawings schematically show ideal examples, and one implementation of the present disclosure is not limited to the shape, the numerical value, and the like shown in the drawings.

In the embodiments of the present disclosure, ordinal numbers such as "first", "second", "third", and the like are provided to avoid confusion of constituent elements, and are not limited in number.

In the embodiments of the present disclosure, for convenience, the words and phrases indicating orientations or positional relationships, such as "middle", "upper", "lower", "front", "rear", "vertical", "horizontal", "top", "bottom", "inner", "outer", and the like are used to explain positional relationships of constituent elements with reference to the drawings, only for convenience of description and simplification of description, but not to indicate or imply that the device or element referred to must have a specific orientation, be configured and operated in a specific orientation, and thus, should not be construed as limiting the present disclosure. The positional relationship of the component elements is changed as appropriate in accordance with the direction in which the component elements are described. Therefore, the words and phrases described in the specification are not limited thereto, and may be replaced as appropriate depending on the cases.

In the embodiments of the present disclosure, the terms "mounted", connected", and "coupled" are to be construed broadly unless otherwise explicitly specified or limited. For example, it may be a fixed connection, or a detachable connection, or an integral connection; it may be a mechanical connection, or an electrical connection; and it may be either directly or indirectly through intervening components, or two elements may be interconnected. The specific meaning of the above terms in the present disclosure may be understood in a specific case to those skilled in the art.

In the embodiment of the present disclosure, a transistor refers to an element including at least three terminals of a gate, a drain, and a source. The transistor has a channel region between the drain (a drain terminal, a drain region, or a drain electrode) and the source (a source terminal, a source region, or a source electrode), and a current may flow through the drain, the channel region, and the source. It should be noted that, in the present disclosure, the channel region refers to a region through which the current mainly flows.

In the embodiments of the present disclosure, a first electrode may be a drain, and a second electrode may be a source, or a first electrode may be a source and a second electrode may be a drain. In the case of using transistors of opposite polarities, or in the case where the direction of current during circuit operation changes, the functions of the "source" and the "drain" may be interchanged. Therefore, in the present disclosure, the "source" and the "drain" may be interchanged with each other.

In the embodiments of the present disclosure, "electrically coupled" includes a case where constituent elements are coupled together by an element having some kind of electrical action. The "element having some kind of electrical action" is not particularly limited as long as it can transmit and receive an electrical signal between connected components. Examples of the "element having some kind of electric action" include not only an electrode and a wiring but also a switching element such as a transistor, a resistor, an inductor, a capacitor, other elements having various functions, and the like.

In the embodiment of the present disclosure, "parallel" means a state in which an angle formed by two straight lines is more than −10° and less than 10°, and therefore, includes a state in which the angle is more than −5° and less than 5°. In addition, "perpendicular" means a state in which an angle formed by two straight lines is more than 80° and less than 100°, and therefore includes a state in which an angle is more than 8° and less than 95°.

In the embodiments of the present disclosure, "film" and "layer" may be interchanged with one another. For example, a "conductive layer" may be sometimes replaced with a "conductive film". Similarly, an "insulating film" may be replaced with an "insulating layer".

In the embodiments of the present disclosure, "about" refers to a value within the allowable process and measurement error range without strict limits In a first aspect, referring to FIGS. 1 to 17, a display substrate is provided according to an embodiment of the present disclosure.

The display substrate according to an embodiment of the present disclosure is a substrate, such as an array substrate provided with a Thin Film Transistor (TFT) array, in a display device.

The display substrate according to an embodiment of the present disclosure includes a display region 91 and a peripheral region, which surrounds the display region 91 and includes a capacitor region 95, a circuit region 92, a fan-out region 93, and a joint region 94.

The display region 91 is provided with: a plurality of sub-pixels 1; a plurality of data lines 11 extending in a first direction 991, each of the plurality of data lines 11 being coupled to multiple sub-pixels 1; a plurality of gate lines 12 extending in a second direction 992 intersecting the first direction 991, each of the plurality of gate lines 12 being coupled to multiple sub-pixels 1.

The circuit region 92 surrounds the display region 91, and includes a first sub-region 921 and a second sub-region 922 opposite to each other respectively on two sides of the display region 91 in the first direction 991. The first sub-region 921 is provided with a plurality of multiplexing unit groups configured to provide data signals to the plurality of data lines 11. Each of the multiplexing unit groups includes at least one multiplexing unit 2. The second sub-region 922 is provided with a plurality of testing unit groups configured to provide test signals to the plurality of data lines 11. Each of the testing unit groups includes at least one testing unit 3. The circuit region 92 is further provided with a plurality of driving unit groups, and each of the driving unit groups includes at least one driving unit 4. In the first sub-region 921, the driving unit groups and the multiplexing unit groups are alternately arranged along a circumferential direction of the display region 91, and in the second sub-region 922, the driving unit groups and the testing unit groups are alternately arranged along the circumferential direction.

The capacitor region 95 is between the second sub-region 922 and the display region 91. A plurality of compensation capacitor units 5 is provided in the capacitor region 95, and each of the plurality of compensation capacitor units 5 is coupled to one of the data lines 11.

The joint region 94 is on a side of the first sub-region 921 distal to the display region 91. A plurality of joints 6 are provided in the joint region 94, and at least some of the joints 6 are coupled to signal lines. The signal lines include multiplexing signal lines 62 coupled to multiplexing units 2, testing signal lines 63 coupled to testing units 3, and driving signal lines 64 coupled to driving units 4.

The fan-out region 93 is between the joint region 94 and the first sub-region 921. A plurality of multiplexing signal lines 62 are provided in the fan-out region 93.

Referring to FIGS. 1, 2, 4 and 5, the display substrate according to an embodiment of the present disclosure is divided into a plurality of regions, among which the region in the center is the display region 91 (i.e., an AA region) for displaying. The sub-pixels 1 for displaying are provided in the display region 91.

A sub-pixel 1 is the smallest structure that may be used to independently display a desired content, i.e., the sub-pixel 1 is the smallest "point" that may be independently controlled in the display device.

The sub-pixel 1 may have any type of form as long as an independent display may be achieved.

Exemplarily, the sub-pixel 1 may include a pixel circuit to emit light in a desired brightness under a control of a corresponding gate line 12, a corresponding data line 11, and the like. For example, referring to FIG. 3, the pixel circuit may have a structure of 7T1C (i.e., including 7 transistors and 1 capacitor) including a first transistor T1, a second transistor T2, a third transistor T3, a fourth transistor T4, a fifth transistor T5, a sixth transistor T6, a seventh transistor T7, a storage capacitor Cst, an organic light emitting diode OLED, a first reset terminal Reset, a second reset terminal Reset', an initializing terminal Vinit, a gate line terminal Gate, a data line terminal Data, a control electrode terminal EM, an anode signal terminal VDD, a cathode signal terminal VSS, and the like. Each of the transistors may be a P-type transistor (e.g., PMOS). The data line terminal Data may be coupled to the data line 11, the gate line terminal Gate may be coupled to the gate line 12, the control electrode line terminal EM may be coupled to a control electrode line 13, both the first reset terminal Reset and the second reset terminal Reset' may be coupled to the gate line in a previous row, the second reset terminal Reset' may also be coupled to the gate line in the current row, and the other terminals may also be coupled to corresponding signal sources.

That is, in each of the sub-pixels 1 of the display substrate according to an embodiment of the present disclosure, an organic light emitting diode OLED may be used as a light emitting element, i.e., specifically, the display substrate may be an organic light emitting diode display substrate, or the display substrate may be an array substrate provided with a thin film transistor (TFT) array.

Different sub-pixels 1 may emit light of different colors, so that a color display may be achieved by mixing light from different sub-pixels 1. When the color display is to be implemented, multiple sub-pixels 1 of different colors arranged together may form a "pixel (i.e., pixel unit)", that is, light emitted by these sub-pixels 1 is mixed together to form a "point" visually. For example, one pixel may be constituted of three sub-pixels 1 which emit light of three colors of red, green, and blue respectively. Alternatively, a color display may be achieved by "sharing" a sub-pixel between adjacent sub-pixels 1 without a definite pixel (or pixel unit).

Referring to FIGS. 1, 2, 4 and 5, the display region 91 is further provided with data lines 11 extending in a first direction 991, and gate lines 12 extending in a second direction 992. The first direction 991 crosses (i.e., is not parallel to) the second direction 992, so that one sub-pixel 1 may be defined at one of crossing positions where the data lines 11 crosses the gate lines 12. The sub-pixel 11 at the crossing position may be for display by a common control of the gate line 12 and the data line 11.

In some embodiments, the first direction 991 is perpendicular to the second direction 992, i.e., the first direction 991 may be a column direction (a vertical direction in FIGS. 1, 2, 4 and 5), and the second direction 992 may be a row direction (a lateral direction in FIGS. 1, 2, 4 and 5) perpendicular to the column direction.

It is to be understood that, the first direction 991 and the second direction 992 are substantially only two directions with respect to each other respectively corresponding to the data lines 11 and the gate lines 12. The two directions are not necessarily a column direction and a row direction, and have no necessary relationship with a shape, a position, a placement, and the like, of the display substrate (or the display device).

In some embodiments, the sub-pixels 1 in the display region 91 may be arranged in an array, i.e., the sub-pixels 1 may be arranged in multiple rows and multiple columns. Each row of sub-pixels 1 is coupled to one gate line 12, and each column of sub-pixels 1 is coupled to one data line 11.

It is to be understood that, the sub-pixels 1 are not necessarily arranged in an array, and each of the data and gate lines 11 and 12 is not necessarily coupled to the sub-pixels 1 in a same column and row respectively.

Referring to FIGS. 1, 2, 4 and 5, the region outside the display region 91 is the circuit region 92 surrounding the display region 9, so that the display region 91 as a whole has a shape of an annulus. A peripheral region of the display region 91 is not used for displaying, so that it corresponds to a "bezel" of the display device.

The peripheral region includes the circuit region 92 surrounding the display region 91, so that the circuit region 92 as a whole also has a shape of an annulus and includes a first sub-region 921 and a second sub-region 922 opposite to each other on two sides of the display region 91 in the first direction 991. The first sub-region 921 and the second sub-region 922 correspond to for example a "lower half region" and an "upper half region" in FIGS. 1 and 2 respectively. The first sub-region 921 is provided with a plurality of multiplexing units 2 (MUX), which are coupled to the data lines 11 at one side (a lower side in FIGS. 1, 2, 4 and 5) for providing data signals (data voltages) to the data lines 11 during displaying. The second sub-region 922 is provided with a plurality of testing units 3 (CT), which are coupled to the data lines 11 at the other side (a upper side in FIGS. 1, 2, 4 and 5) for providing testing signals to the data lines 11 during testing to detect whether the display substrate is defective.

In addition, the circuit region 92 is provided with a plurality of driving units 4 for providing other driving signals.

In some embodiments, at least some of the driving units 4 are configured to provide driving signals to the gate lines 12, i.e., at least some of the driving units 4 are coupled to the above gate lines 12 and are used to provide signals to the gate lines 12 for controlling the working of the sub-pixels 1 coupled to respective gate lines 12.

It can be seen that the above multiplexing units 2 constitute the plurality of "multiplexing unit groups", each of which includes one multiplexing unit 2 or multiple multiplexing units 2 consecutively arranged. The testing units 3 constitute the plurality of "testing unit groups", each of which includes one testing unit 3 or multiple testing units 3 consecutively arranged. The driving units 4 constitute the plurality of "driving unit groups", each of which includes one driving unit 4 or multiple driving units 4 consecutively arranged. Thus, the circuit region 92 is provided with different units which are "mixed" in arrangement.

Specifically, referring to FIGS. 1, 2, 4, 5, 14 and 15, in the first sub-region 921, the driving unit groups and the multiplexing unit groups are alternately arranged in the "peripheral direction".

The term "peripheral direction" refers to a direction of rotation about a center of a planar pattern, or a direction of clockwise or counterclockwise rotation about an edge of a planar pattern.

That is, in the embodiment of the present disclosure, when traversing the circuit region 92 substantially having a shape of an annulus in a clockwise or a counterclockwise direction, the driving unit groups and the multiplexing unit groups are alternately arranged in the first sub-region 921, that is, in a manner of one driving unit group-one multiplexing unit group-one driving unit group-one multiplexing unit group . . . and so on. Of course, each "group" includes one or more consecutive corresponding units, so that the driving units 4 and the multiplexing units 2 in the first sub-region 921 are "mixed" in arrangement (but multiple same units may be consecutively arranged), rather than being concentrated in different positions in the first sub-regions 921, respectively.

Specifically, in FIGS. 1, 2, 4, 5, 14 and 15, in the second sub-region 922, the driving unit groups and the testing unit groups are alternately arranged in the peripheral direction.

That is, when traversing the circuit region 92 substantially having a shape of an annulus in a clockwise or a counterclockwise direction, the driving unit groups and the testing unit groups are alternately arranged in the second sub-region 922, that is, in a manner of one driving unit group-one testing unit group-one driving unit group-one testing unit group . . . and so on. Of course, each "group" includes one or more consecutive corresponding units, so that the driving units 4 and the testing units 2 in the second sub-region 922 are "mixed" in arrangement (but multiple same units may be consecutively arranged), rather than being concentrated in different positions in the second sub-regions 922, respectively.

In an exemplary embodiment, in the first sub-region 921, a number of the multiplexer units 2 between adjacent two driving units 4 is determined according to a size of a gap between the adjacent two driving units 4.

In an exemplary embodiment, in the second sub-region 922, a number of testing units 3 between two adjacent driving units 4 is determined according to a size of a gap between the two adjacent driving units 4.

In an exemplary embodiment, a gap between any two adjacent units (e.g., the multiplexer units 2, the testing units 3 and the driving units 4) is larger than 1 micrometer. Exemplarily, a gap between two adjacent driving units 4 may be 1.5 micrometers, a gap between the driving unit 4 and adjacent multiplexing unit 2 may be 1.5 micrometers, and a gap between the driving unit 4 and adjacent testing unit 3 may be 1.5 micrometers, and the like.

The above "gap" refers to a shortest straight line distance between elements in two adjacent units, respectively.

Obviously, circuits in the circuit region 92 also need certain signals to operate, so that the peripheral region is further provided with a joint region 94 for introducing these signals. The joint region 94 is provided with a plurality of joints 6 coupled to signal lines. The signal lines may include multiplexing signal lines 62, testing signal lines 63, driving signal lines 64, etc., for respectively supplying power to the multiplexing units 2, the testing units 3, and the driving units 4. Of course, the signal lines are coupled to corresponding units and joints 6 respectively.

The joints 6 (Pads or Pins) refers to a structure in the display substrate that may acquire signals and introduce the signals to the signal lines.

Specifically, the joints 6 may be used for bonding with a flexible printed circuit (FPC) or a driving chip, so as to obtain the signals from the flexible printed circuit or the driving chip.

Optionally, the joints 6 may be used to be in contact with testing probes of a testing device to obtain signals from the testing probes.

Referring to FIGS. 1, 2, 4 and 5, the joint region 94 is on a side (i.e., an outer side) of the circuit region 92 distal to the display region 91, and the fan-out region 93 is further provided between the joint region 94 and the first sub-region 921. The fan-out region (Fanout region) 93 is provided with a plurality of multiplexing signal lines 62, that is, after being led out from the joint region 94, the multiplexing signal lines 62 are coupled to corresponding multiplexing units 2 across the fan-out region 93.

Generally, the number of multiplexing signal lines 62 is much more than a sum of the numbers of testing signal lines 63 and the driving signal lines 64. Therefore, by providing the fan-out region 93 between the joint region 94 and the first sub-region 921 provided with the multiplexing units 2, the much more number of multiplexing signal lines 62 may be coupled to the multiplexing units 2 with a less distance. Although the driving signal lines 64 and the testing signal lines 63 need to extend a long distance to be coupled to the driving units 4 and the testing units 3 respectively, due to the less number of the driving signal lines 64 and the testing signal lines 63, a total length of all the driving signal lines 64 and the testing signal lines 63 is not too large. Therefore, by the above design, the total length and the occupied layout region of the signal lines may be reduced, the bezel of the display device may be reduced, and the screen-to-body ratio is increased.

Of course, in addition to the multiplexing signal lines 62, a part of the driving signal lines 64 and the test signal lines 63 may be in the fan-out region 93.

Figure 2:
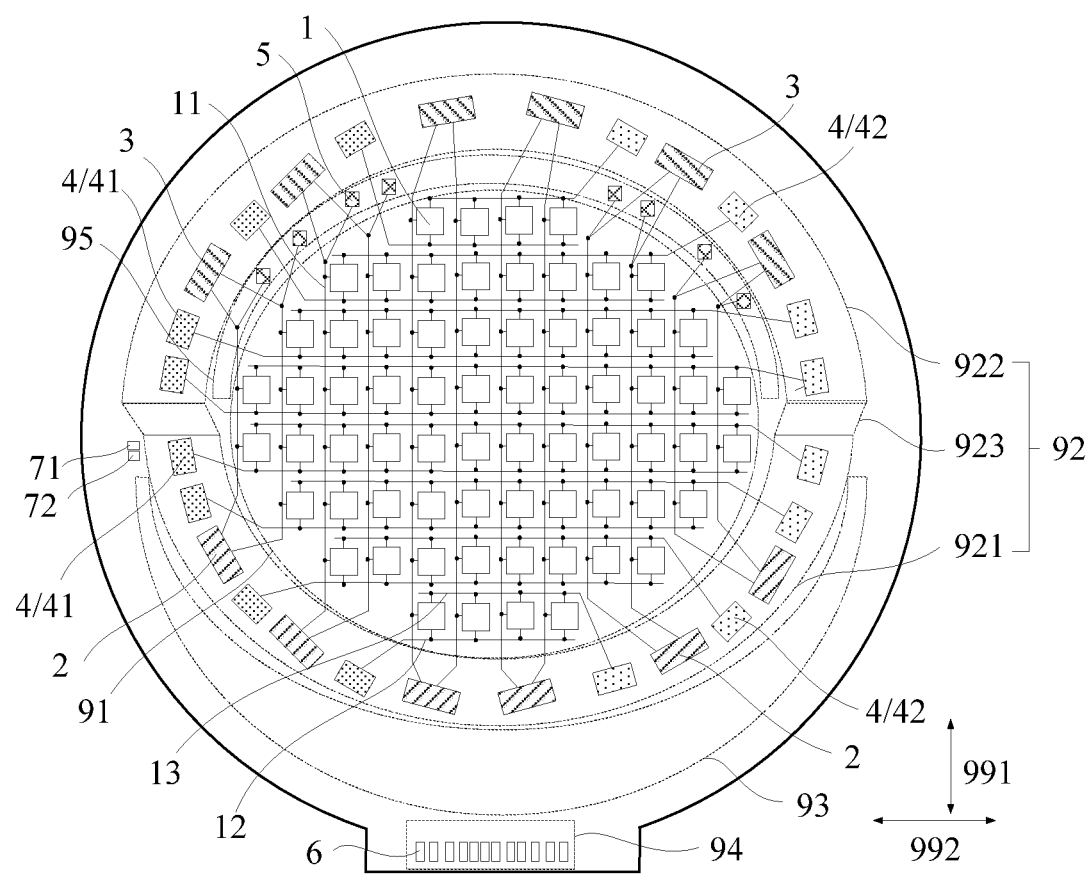
FIG. 2 is a schematic diagram illustrating a structure of a display substrate (some lines not shown) according to an embodiment of the present disclosure.
Figure 3:
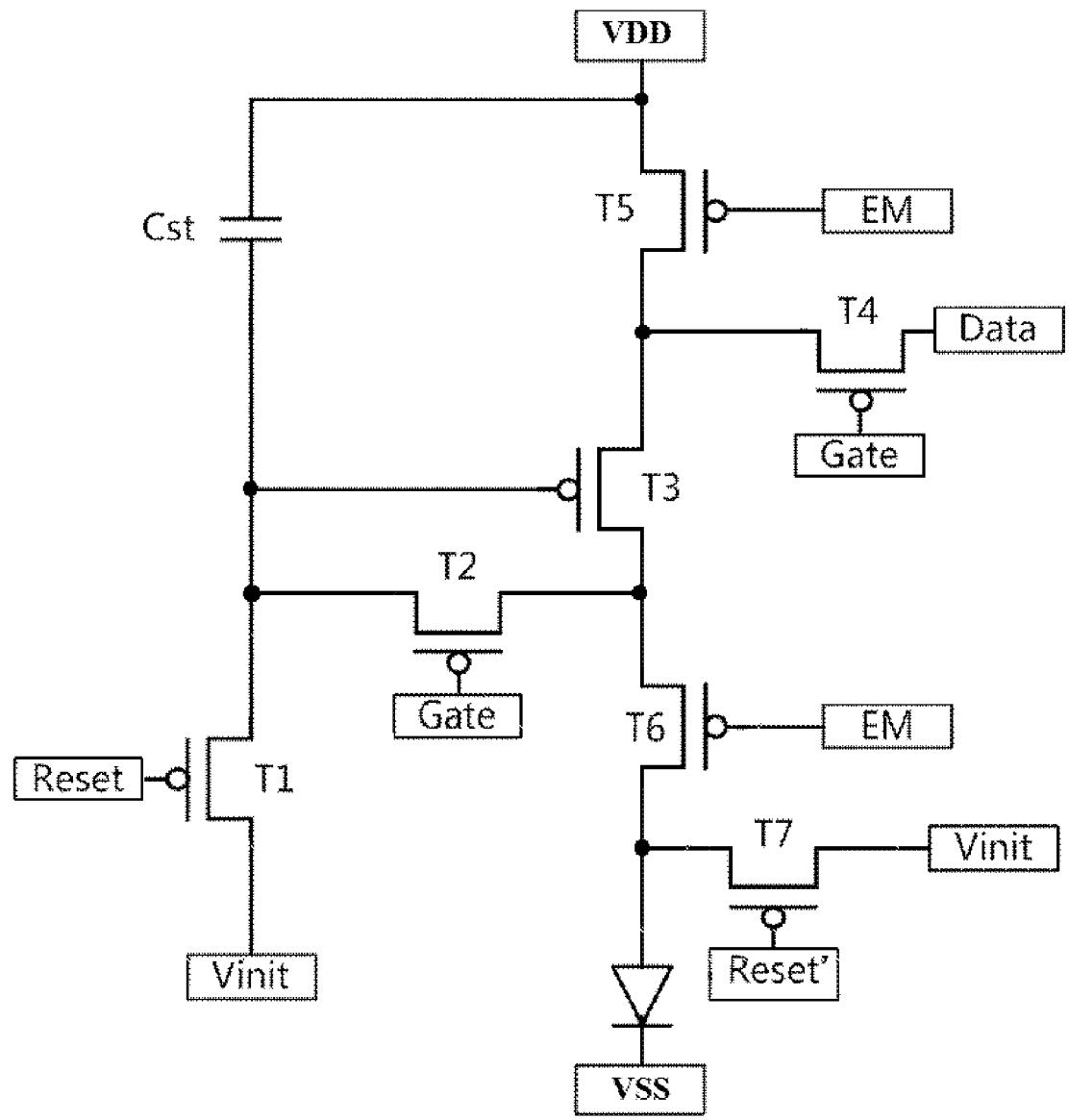
FIG. 3 is a schematic diagram illustrating a pixel circuit in a display substrate according to an embodiment of the present disclosure.

Referring to FIGS. 1 and 2, since there is no fan-out region 93 at a side (the upper side in FIGS. 1 and 2) where the second sub-region 922 is located, there may be a space for other structures. Therefore, a capacitor region 95 may be provided between the second sub-region 922 and the display region 91. A plurality of compensation capacitor units 5 coupled to the data lines 11 are provided in the capacitor region 95 for compensating capacitance differences between different data lines 11, which will be described in detail later.

Referring to FIGS. 1, 2, 4 and 5, the units (including the multiplexing units 2, the testing units 3, and the driving units 4) in the display substrate according to an embodiment of the present disclosure are arranged to be mixed, so that the units may provide signals to the corresponding data lines 11, the corresponding gate lines 12, and the like, respectively, in a less distance. Meanwhile, by a relatively uniform distribution of the structures on the display substrate, the space of the display substrate may be fully utilized, the bezel of the display device may be reduced, and the screen-to-body ratio may be increased.

In some embodiments, the first sub-region 921 includes a first arc region and the second sub-region 922 includes a second arc region. An edge of the first arc region 921 proximal to the display region 91 is closer to a center of the display region 92 than an edge of the second arc region proximal to the display region 92.

Figure 14:
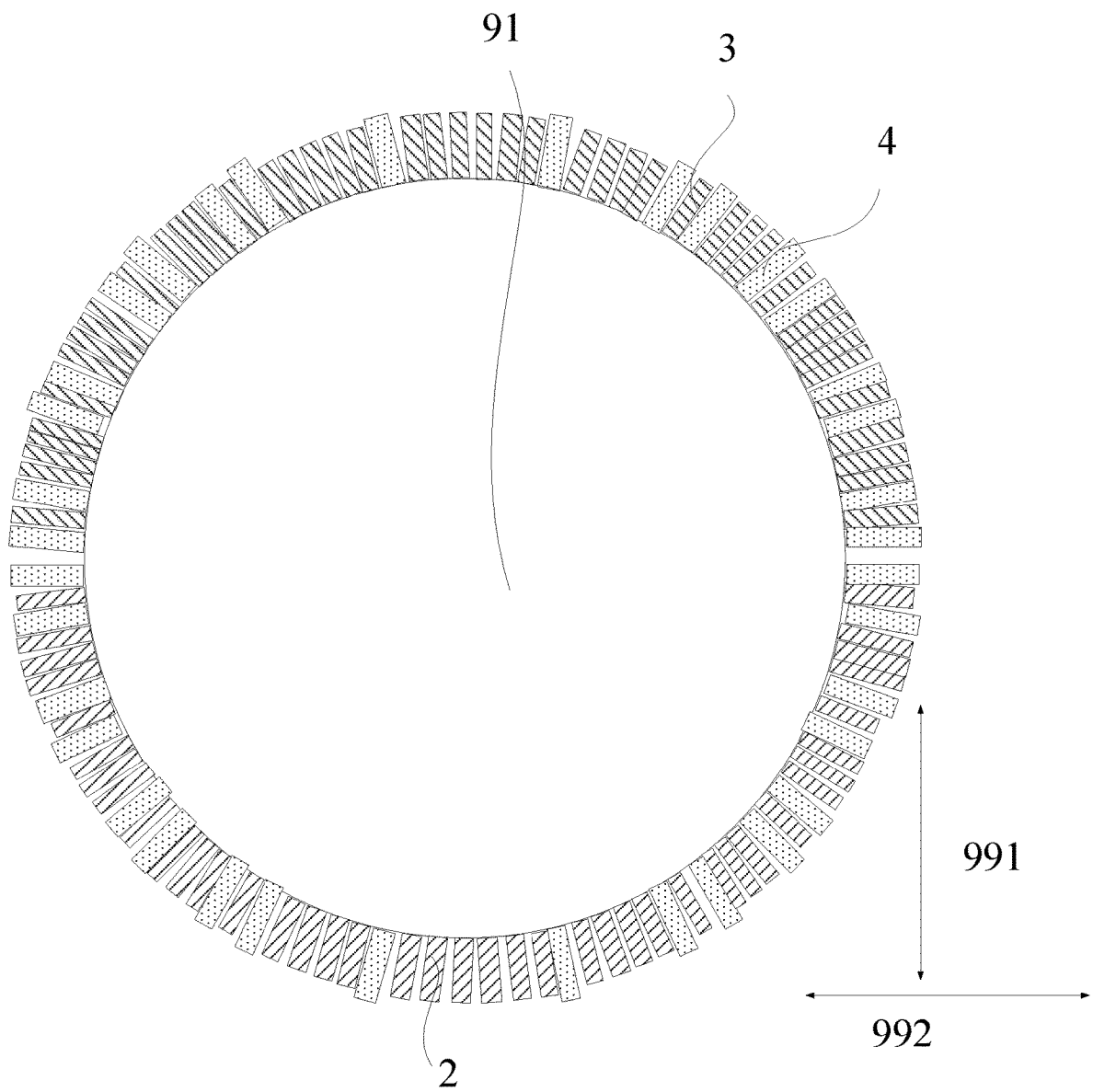
FIG. 14 is a schematic diagram illustrating distribution densities of different units in a display substrate according to an embodiment of the present disclosure.

Referring to FIGS. 1, 2 and 14, the first sub-region 921 and the second sub-region 922 may include a part of an arc (or an annulus).

Exemplarily, a main surface of the display substrate may have a shape of a substantial circle, and the display region 91 may also have a shape of a circle, so that the circuit region 92 may substantially have a shape of an annulus surrounding and outside the circular display region 91. Each of the first sub-region 921 and the second sub-region 922 has a shape of a "half annulus" (an "upper half annulus" and a "lower half annulus" in FIGS. 1 and 2) with openings of the two opposite to each other.

Moreover, the edge of the first arc region (the first sub-region 921) proximal to the display region 91 is closer to the center of the display region 91 than the edge of the second arc region (the second sub-region 922) proximal to the display region 91, or the first arc region has an inner edge "shorter" than that of the second arc region because the capacitor region 95 is further provided proximal to the inner edge of the second sub-region 922.

In some embodiments, the first arc region (the first sub-region 921) has a same center of a circle as the second arc region (the second sub-region 922), and a radius of the edge of the first arc region proximal to the display region 91 is smaller by 210~420 μm than a radius of the edge of the second arc region proximal to the display region 91.

Exemplarily, the above first arc region and the second arc region may be concentric, with an inner diameter difference therebetween in a range of 210 μm~420 μm (the first arc region has a smaller inner diameter), further in a range of 250 μm 350 μm.

The main surface of the display substrate may be a side surface of the base substrate thereof, that is, a surface of the base substrate of the display substrate according to an embodiment of the present disclosure may have a shape of a circle.

The base substrate is a base for supporting other structures of the display substrate. The base substrate is of a substantial sheet made of a material such as glass, silicon (e.g., monocrystalline silicon), a polymer material (e.g., polyimide), may be rigid or flexible, and has a thickness of millimeter order.

In the embodiment of the present disclosure, "A is substantially B" refers to that, on a scale of A as a whole, A conforms to features of B, but on a scale that is significantly smaller than A as a whole, A may not completely conform to features of B. For example, "A is substantially circular" refers to that A may be a perfect circle or ellipse, or A as a whole may be a circle or ellipse with some detailed parts being not strictly circular. For example, a small part of the boundary of A may be a straight line, a broken line, and the like. For another example, a small part of the boundary of A may be an arc which is an approximate arc but not a strict arc. For another example, parts of the boundary of A at different positions may be arcs with different diameters.

Referring to FIGS. 1 and 2, when the circuit region 92 is an "annulus", most of the circuit region 92 is provided with corresponding data lines 11 and gate lines 12 (i.e., there are corresponding sub-pixels 1 in both the row and column directions). In this case, the multiplexing units 2, the testing units 3, and the driving units 4 in the circuit region 92 are arranged to be mixed, which is most beneficial for the units to be coupled to corresponding data lines 11 and gate lines 12 with a less distance.

Of course, a specific shape of the display substrate and the regions thereof are not limited to the above shapes, and the display substrate and the regions thereof may have other shapes.

For example, in other embodiments, the first sub-region 921 includes a first U-shaped region, and the second sub-region 922 includes a second U-shaped region.

Figure 4:
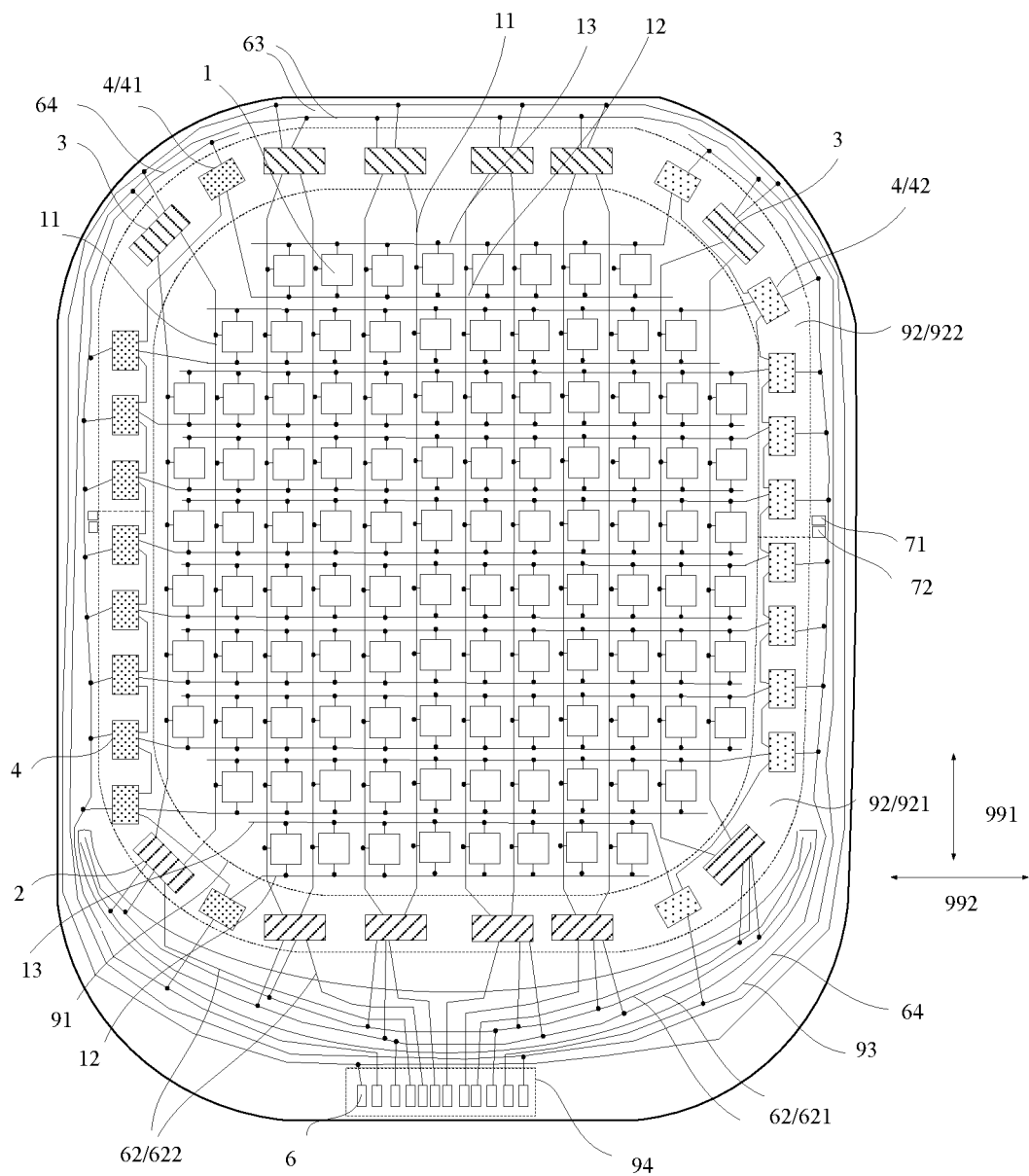
FIG. 4 is a schematic diagram illustrating a structure of a display substrate according to an embodiment of the present disclosure.
Figure 5:
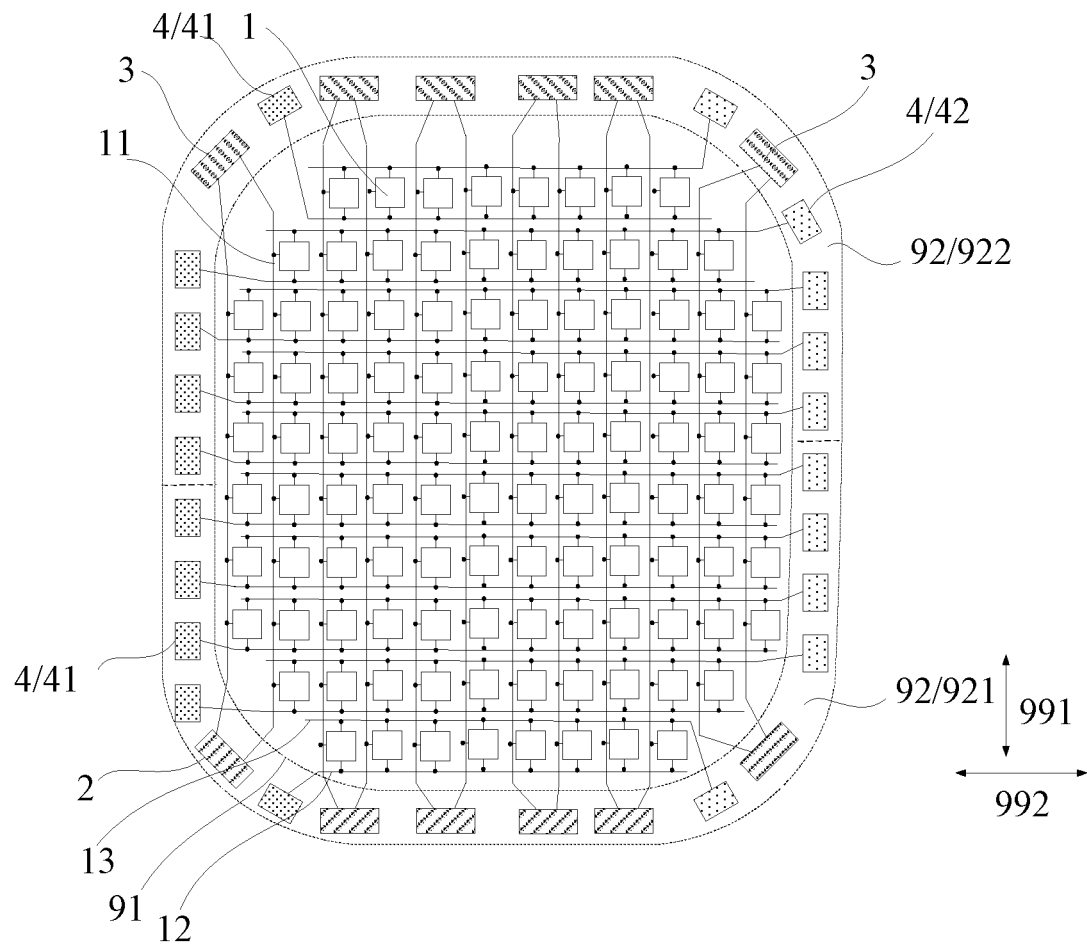
FIG. 5 is a schematic diagram illustrating a structure of a display substrate (some lines not shown) according to an embodiment of the present disclosure.
Figure 15:
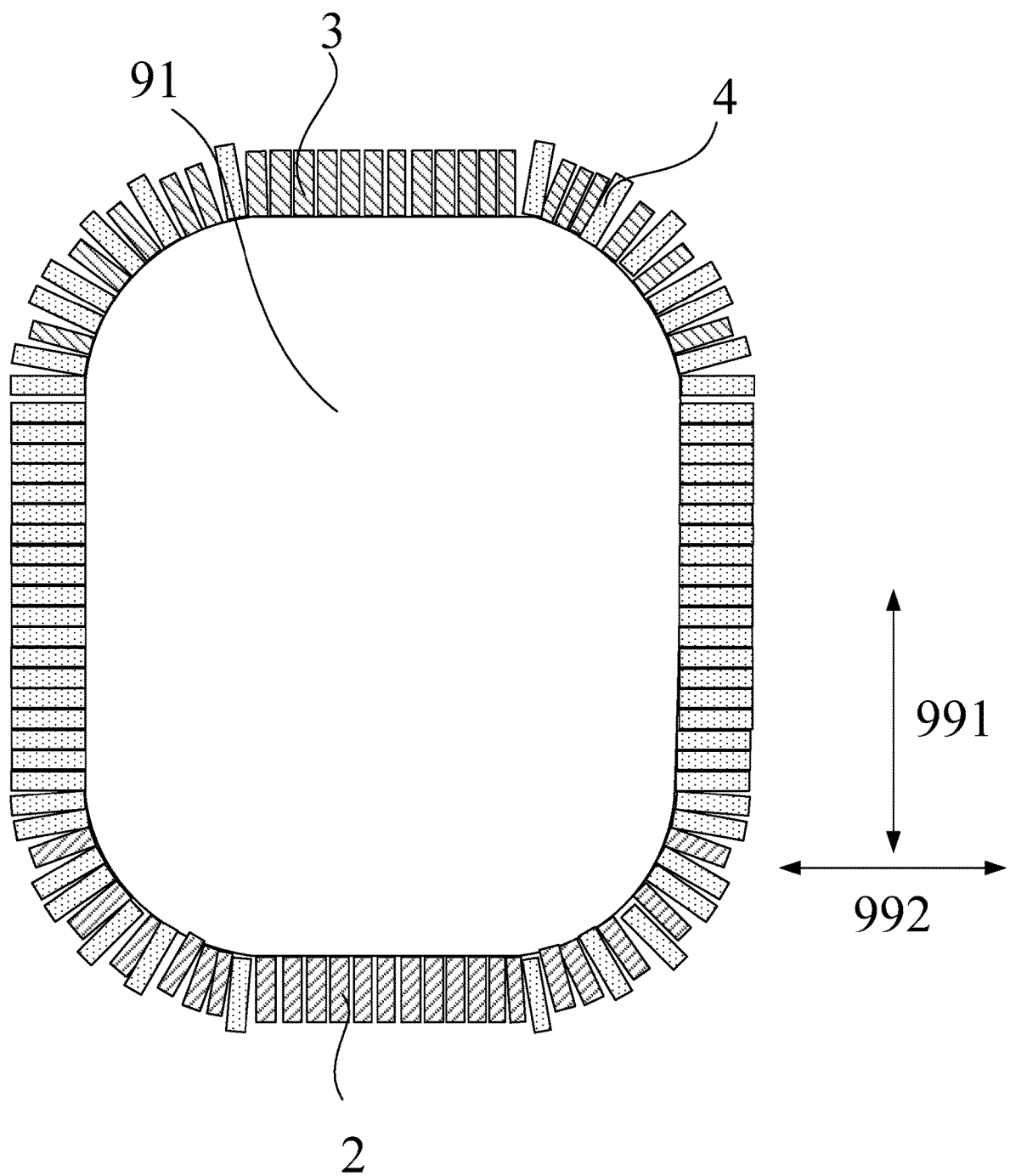
FIG. 15 is a schematic diagram illustrating distribution densities of different units in a display substrate according to an embodiment of the present disclosure.

Referring to FIGS. 4, 5 and 15, as another implementation according to an embodiment of the present disclosure, a main surface of the display substrate may also have a shape of substantially an arc angle rectangle (referred to as a rectangle with arc corners, a rounded rectangle or an arcuate rectangle), and the display region 91 may also have a shape of substantially an arc angle rectangle, so that the circuit region 92 is substantially an arcuate rectangular ring surrounding the arc rectangular display region 91.

Thus, each of the first sub-region 921 and the second sub-region 922 is a "U-shaped ring" (an "upper U-shaped ring" and a "lower U-shaped ring" with two openings opposite to each other in FIGS. 4 and 5), and a bottom of each of the upper U-shaped ring and the lower U-shaped ring is of two straight lines other than arcs.

The "arc angle rectangle" refers to a shape similar to a rectangle, which has four straight sides with four "arc corners" of relatively uniform transition other than four right angles. The four "arc angles" may further be referred to as "round angles", that is, the "arc angle rectangle" may also be a "rounded rectangle".

Accordingly, the circuit region 92 is "an annulus region of an arc angle rectangle", which is an annular region sandwiched between two "arc angle rectangles" of different sizes, and thus may also be considered as a "hollowed-out arc angle rectangle". Of course, further, the circuit region 92 may also be "an annulus region of a rounded rectangle" (i.e., a "hollowed-out rounded rectangle").

In some embodiments, the first U-shaped ring has a width (i.e., a distance between two straight lines) approximately equal to that of the second U-shaped ring, and the first U-shaped ring (i.e., a distance from a bottom of the U-shape ring distal to its opening to its opening) has a height approximately equal to that of the second U-shaped ring.

Referring to FIGS. 4 and 5, the first U-shaped ring may have a substantially same size as the second U-shaped ring, so that the first U-shaped ring and the second U-shaped ring may be substantially "symmetrical up and down" (i.e., symmetrical along the direction 992).

In some embodiments, an inner edge of the first U-shaped ring (i.e., an outer edge of the display region 91) includes two first arc boundaries, and an inner edge of the second U-shaped region (i.e., the outer edge of the display region 91) includes two second arc boundaries. An inner edge of the circuit region (i.e., the outer edge of the display region 91) further includes: two first straight boundaries extending in the first direction 991 (each of the first straight boundaries is across the first sub-region 921 and the second sub-region 922), a second straight boundary (belonging to the first sub-region 921) and a third straight boundary (belonging to the second sub-region 922) extending in the second direction 992.

It should be understood that, of course, outer edges of the first sub-region 921 and the second sub-region 922 (i.e., an outer edge of the circuit region 92) should have a shape substantially similar to their inner edges.

Further, distances from any point of the inner edge of the circuit region 92 to the outer edge thereof along a normal direction are the same, i.e., the circuit region 92 may have a same width at any point of the inner edge to the outer edge of the circuit region 92.

In some embodiments, in the first sub-region 921 and the second sub-region 922, multiple driving units 4 are arranged along the first straight boundaries. In the first sub-section 921, multiple multiplexing units 2 are arranged along the second straight boundary. In the second sub-section 922, multiple testing units 3 are arranged along the third straight boundary.

In some embodiments, in the first sub-section 921, the driving units 4 and the multiplexing units 2 are alternately arranged along the first arc boundary; and in the second sub-section 922, the driving units 4 and the testing units 3 are alternately arranged along the second arc boundary.

That is, referring to FIGS. 4 and 5, when the first sub-region 921 and the second sub-region 922 include the above "annular region of an arc angle rectangle", different units may be arranged in a mixed manner only at positions along "arc angles of the annular region of the arc angle rectangle", and only a same type of units may be arranged at positions along "edges of a straight line of the annular region of the arc angle rectangle".

In some embodiments, in the first sub-region 921, a trace of connecting center points of coverage regions of the driving units 4 arranged along the first arc boundary constitute a first arc trace, a trace of connecting center points of coverage regions of the multiplexing units 2 arranged along the first arc boundary constitute a second arc trace. Circle centers of the first and second arc traces coincide with a circle center of the first arc boundary.

In some embodiments, in the second sub-region 922, a trace of connecting center points of coverage regions of the driving units 4 arranged along the second arc boundary constitute a third arc trace, a trace of connecting center points of coverage regions of the testing units 3 arranged along the second arc boundary constitute a fourth arc trace. Circle centers of the third and fourth arc traces coincide with a circle center of the second arc boundary.

That is, referring to FIGS. 4 and 5, in each of the sub-regions, each type of the units along corresponding arc boundary are arranged along an arc trace. Circles corresponding to the arc traces of two types of units along a same arc boundary, and a circle corresponding to the same arc boundary, are concentric.

In some embodiments, in first sub-region 921, the multiplexing unit groups includes first multiplexing unit groups each of which includes M multiplexing units 2 and second multiplexing unit groups each of which includes N multiplexing units 2. N and M are integers each greater than 1, and M<N. The second multiplexing unit groups are in the middle of first sub-region 921, and the first multiplexing unit groups are at two ends of the first sub-region 921 distal to the middle of the first sub-region 921. And/or, in the second sub-region 922, the testing unit groups include first testing unit groups and second testing unit groups. Each of the first testing unit groups includes K testing units 3, and each of the second testing unit groups includes L testing units. L and K are integers each greater than 1, and K<L. The second testing unit groups are in the middle of the second sub-region 922, and the first testing unit groups are at two ends of the second sub-region 922 distal to the middle of the second sub-region 922.

In the middle of the first sub-region 921 (i.e., at an arc top of the semicircular annulus), at least one second multiplexing unit group is provided therein. Each of the at least one second multiplexing unit group includes N multiplexing units 2. At least one first multiplexing unit group is provided at the two ends of the first sub-region 921 (i.e., the two ends or the opening of the semicircular annulus), and each of the at least one first multiplexing unit group includes M multiplexing units 2, where M is less than N.

That is, the multiplexing unit groups (the second multiplexing unit groups) are provided in the middle of the first sub-region 921, and includes a larger number of multiplexing units 2. The multiplexing unit groups (the first multiplexing unit groups) are provided at both ends of the first sub-region 921, and includes a smaller number of multiplexing units 2. Thus, as a whole, a larger number of multiplexing units 2 and a smaller number of driving units 4 are provided in the middle of the first sub-region 921, and a smaller number of multiplexing units 2 and a larger number of driving units 4 are provided at both ends of the first sub-region 921.

In some embodiments, N may be a value of 7, or 6, or 5; and in some embodiments, M may be a value of 1, or 2, or 3.

In some embodiments, there may be other multiplexing unit groups between the first and second multiplexing unit groups, and a number of multiplexing units in these other multiplexing unit groups may be larger than M and smaller than N.

At least one second testing unit group is provided in the middle of the second sub-region 922 (i.e., at an arc top of the semicircular annulus), and each of the at least one second testing unit group includes L testing units 3. At least one first testing unit group is provide at two ends (i.e., the two ends or the opening of the semicircular annulus) of the second sub-region 922, and each of the at least one first testing unit group includes K testing units 3, where K is less than L.

That is, the testing unit groups (the second testing unit groups) are provided in the middle of the second sub-region 922, and includes a larger number of testing units 3. The testing unit groups (the first testing unit groups) are provided at both ends of the first sub-region 921, and includes a smaller number of testing units 3. Thus, as a whole, a larger number of testing units 3 and a smaller number of driving units 4 are provided in the middle of the second sub-section 922, and a smaller number of testing units 3 and a larger number of driving units 4 are provided at the both ends of the second sub-section 922.

In some embodiments, L may be a value of 7, or 6, or 5; and in some embodiments, K may be a value of 1, or 2, or 3.

In some embodiments, other testing unit groups are provided between the first testing unit group and the second testing unit group, and a number of testing units in the other testing unit groups may be larger than K and smaller than L.

In some embodiments, in the first sub-region 921, in a direction from the two ends of the first sub-region 921 to the middle of the first sub-region 921, the driving units 4 have gradually decreasing distribution density, and the multiplexing units 2 have gradually increasing distribution density.

In the second sub-region 922, in a direction from the two ends of the second sub-region 922 to the middle of the second sub-region 922, the driving units 4 have gradually decreasing distribution density, and the testing units 3 have gradually increasing distribution density.

In each of the sub-regions of the circuit region 92, in the direction from the two ends of the sub-regions (i.e., positions adjacent to the other sub-region) to the middle of the sub-regions (i.e., a position furthest away the positions adjacent to the other sub-region), the driving units 4 have gradually decreasing distribution density, and the testing units 3 have gradually increasing distribution density.

The increasing distribution density of units A in a certain direction does not refer to that the number of the units A increases gradually at positions where the units A are alternately arranged in the certain direction, but only that the number of the units A gradually increases from the overall distribution of the units A in a relatively large region in the certain direction.

The decreasing distribution density of units A in a certain direction does not refer to that the number of the units A decreases gradually at positions where the units A are alternately arranged in the certain direction, but only that the number of the units A gradually decreases from the overall distribution of the units A in a relatively large region in the certain direction.

Exemplarily, referring to FIGS. 1 and 2, when the first sub-region 921 and the second sub-region 922 include the above first and second arc regions respectively, the closer to the arc tops (the upper and lower sides of FIGS. 1 and 2) of the semicircular annulus of the above two sub-regions 921 and 922, less rows of sub-pixels 1 (i.e., a smaller number of gate lines 12) and more columns of sub-pixels 1 (i.e., a larger number of data lines 11) correspond to a same arc length (or a same central angle) in the above two sub-regions 921 and 922. On the contrary, the closer to the two ends or the opening (the middle along a longitudinal direction in the drawings) of the two semicircular annuluses, less columns of sub-pixels 1 (i.e., a smaller number of data lines 11) and more rows of sub-pixels 1 (i.e., a larger number of gate lines 12) correspond to a same arc length.

Therefore, referring to FIGS. 1 and 2, the "distribution density" of the driving units 4 conforms to the following rule: in order to enable the units to be coupled to corresponding row and column of sub-pixels 1 nearby (or in a less distance), the closer to the arc top of the semicircular annulus, the more the multiplexing units 2 or the testing units 3 are, and the less the driving units 4 are; conversely, the closer to the opening of the semicircular annulus, the less the multiplexing units 2 or the testing units 3 are, and the more the driving units 4 are.

Of course, specific distribution positions and quantities, etc., of the units in the circuit region 92 should be determined according to specific distribution positions and quantities, etc., of the gate lines 12, data lines 11, etc., in the display region 91, so as to make the units close to their own connecting line as much as possible.

Exemplarily, referring to FIGS. 4 and 5, in a case where the first sub-region 921 and the second sub-region 922 are the above first and second U-shaped regions respectively, the distribution density of the multiplexing units 2, the testing units 3, and the driving units 4 also conforms to the above rule.

That is, in the above two U-shaped regions, the closer to the tops (the upper and lower ends in FIGS. 4 and 5) of the U-shaped regions, less rows of the sub-pixels 1 (i.e., a smaller number of gate lines 12) and more columns of sub-pixels 1 (i.e., a larger number of data lines 11) correspond to a same side length; conversely, the closer to the two ends of the U-shaped regions (the middle along the longitudinal direction in FIGS. 4 and 5), less columns of sub-pixels 1 (i.e., a smaller number of data lines 11) and more rows of sub-pixels 1 (i.e., a larger number of gate lines 12) correspond to a same side length.

Thus, referring to FIGS. 4 and 5, in order to enable the units to be coupled to corresponding row and column of sub-pixels 1 nearby, the closer to the tops of the U-shaped regions, the more the multiplexing units 2 or the testing units 3 are, and the less the driving units 4 are; conversely, the closer to the openings of the U-shaped regions, the less the multiplexing units 2 or the testing units 3 are, and the more the driving units 4 are, i.e., the "distribution density" of the driving units 4 conforms to the above rule.

A small number of units are shown in FIGS. 1, 2, 4 and 5 for clarity of other structures, and the distribution density of the units may be further shown in FIGS. 14 and 15 in detail.

In some embodiments, the circuit region 92 is divided into a first half region and a second half region opposite to each other on two sides of the display region 91 along the second direction 992.

The driving units 4 include a plurality of gate driving units 41.

The first half region is provided with a plurality of gate driving units 41 configured to supply a gate driving signal to the plurality of gate lines 12.

Referring to FIGS. 1, 2, 4, and 5, the circuit region 92 may be further divided into two "half regions" opposite to each other on the two sides of the display region 91 along the second direction 992, and each of the "half regions" has a shape of a substantially semicircular annulus (e.g., a left semicircular annulus and a right semicircular annulus in FIGS. 1 and 2) or a U-shape (e.g., a left U-shape annulus and a right U-shape annulus in FIGS. 4 and 5).

Since the gate lines 12 extend along the second direction 992, all the gate lines 12 correspond to the first half region (the left semicircular annulus in FIGS. 1 and 2, or the left U-shaped annulus in FIGS. 4 and 5). Therefore, the driving units 4 in the first half region may include the gate driving units 41 for providing a gate driving signal to the plurality of gate lines 12 (further, all the driving units 4 in the first half region 921 may be the gate driving units 41), so that the gate driving units 41 are coupled to corresponding gate lines 12 nearby.

Specifically, each of the gate driving units 41 may be a gate shift register (as a GOA (a gate driver on array)). A plurality of gate shift registers are cascaded, so that the plurality of gate shift registers may respectively provide a driving signal to the plurality of gate lines 12.

The gate shift register may have various specific forms. Exemplarily, a circuit structure and a driving timing of the gate shift register may refer to FIGS. 9 and 10. Hereinafter, signals of a low level may be equal to a low level signal VGL, and signals of a high level may be equal to a high level signal VGH.

In an input stage t1, a first gate clock signal CK is at a low level, a second gate clock signal CB is at a high level, and an input signal STV is at a low level. Since the first gate clock signal CK is at the low level, a second gate transistor K2 is turned on, and the input signal STV is transmitted to a third gate node N3 via the second gate transistor K2. Since the second gate transistor K2 has a threshold loss, the third gate node N3 is at a level of STV-Vth2, i.e., VGL-Vth2, where Vth2 represents a threshold voltage of the second gate transistor K2. Since a gate of a sixth gate transistor K6 receives the low level signal VGL, the sixth gate transistor K6 is turned on, and thus, the level of VGL-Vth2 is transmitted to a first gate node N1 via the sixth gate transistor K6. For example, a threshold level of the sixth gate transistor K6 is denoted as Vth6. Similarly, since the sixth gate transistor K6 has a threshold loss, the first gate node N1 is at a level of VGL-VthN1, where VthN1 is the smaller one of the Vth2 and the Vth 6. The level at the first gate node N1 may be used to control an eighth gate transistor K8 to be turned on. The second gate clock signal CB is output as a gate output signal GOUT via the eighth gate transistor K8, i.e., in the input stage t1, the gate output signal GOUT is the second gate clock signal CB with a high level, i.e., the gate output signal GOUT is equal to VGH.

In the input phase t1, since the first gate clock signal CK is at the low level, a first gate transistor K1 is turned on, the low level signal VGL is transmitted to a second gate node N2 via the first gate transistor K1. Since the level at the third gate node N3 is VGL-Vth2, a seventh gate transistor K7 is turned on, and the low level of the first gate clock signal CK is transmitted to the second gate node N2 via the seventh gate transistor K7. For example, a threshold voltage of the seventh gate transistor K7 is denoted as Vth7, and a threshold voltage of the first gate transistor K1 is denoted as Vth1. When Vth1<Vth7+Vth2, the level at the second gate node N2 is VGL-Vth7-Vth 2; and when Vth1>Vth7+Vth2, the level at the second gate node N2 is VGL-Vth1. In this case, both the third gate transistor K3 and the fourth gate transistor K4 are turned on. Since the second gate clock signal CB is at the high level, the fifth gate transistor K5 is turned off.

In an output stage t2, the first gate clock signal CK is at a high level, the second gate clock signal CB is at a low level, and the input signal SKT is at a high level. An eighth gate transistor K8 is turned on, and the second gate clock signal CB is output as the gate output signal GOUT via the eighth gate transistor K8. In the input phase t1, a level at one terminal of a second gate capacitor C2 coupled to the first gate node N1 is VGL-VthN1, and a level at the other terminal of the second gate capacitor C2 is a high level. In the output stage t2, the level at the terminal of the second gate capacitor C2 coupled to an output terminal GOUT is changed to VGL. Due to bootstrap of the second gate capacitor C2, the level at the terminal of the second gate capacitor C2 coupled to the first gate node N1 is changed to 2VGL-VthN1-VGH, that is, the level at the first gate node N1 becomes 2VGL-VthN1-VGH. In this case, the sixth gate transistor K6 is turned off, the eighth gate transistor K8 may be turned on better, and the gate output signal GOUT is the low level signal VGL.

In the output stage t2, the first gate clock signal CK is at the high level, so that both the second gate transistor K2 and the first gate transistor K1 are turned off. The level at the third gate node N3 is still maintained at VGL-VthN1, the seventh gate transistor K7 is turned on, and the first gate clock signal CK of the high level is transmitted to the second gate node N2 via the seventh gate transistor K7, that is, the level at the second gate node N2 is VGH. Thus, both the third gate transistor K3 and the fourth gate transistor K4 are turned off. Since the second gate clock signal CB is at the low level, the fifth gate transistor K5 is turned on.

In a buffering stage t3, the first gate clock signal CK and the second gate clock signal CB are both at a high level, and the input signal SKT is at a high level. The eighth gate transistor K8 is turned on, and the second gate clock signal CB is output as the gate output signal GOUT via the eighth gate transistor K8. In this case, the gate output signal GOUT is the second gate clock signal CB with the high level, i.e., VGH. The level at the first gate node N1 is changed to VGL-VthN1 due to the bootstrap of the second gate capacitor C2.

In the buffering period t3, the first gate clock signal CK is at the high level, so that both the second gate transistor K2 and the first gate transistor K1 are turned off. The level at the first gate node N1 is changed to VGL-VthN1. In this case, the sixth gate transistor K6 is turned on, the level at the third gate node N3 is also VGL-VthN1, the seventh gate transistor K7 is turned on, the first gate clock signal CK of the high level is transmitted to the second gate node N2 via the seventh gate transistor K7, that is, the level at the second gate node N2 is VGH. Thus, both the third gate transistor K3 and the fourth gate transistor K4 are turned off. Since the second gate clock signal CB is at the high level, the fifth gate transistor K5 is turned off.

In a first sub-stage t41 of a stabilization stage t4, the first gate clock signal CK is at a low level, the second gate clock signal CB is at a high level, and the input signal SKT is at a high level. Since the first gate clock signal CK is at the low level, the second gate transistor K2 is turned on, and the input signal SKT is transmitted to the third gate node N3 via the second gate transistor K2. Since a high level is transmitted via the second gate transistor K2 without threshold loss, a level at the third gate node N3 is VGH, and the seventh gate transistor K7 is turned off. Since the sixth gate transistor K6 is turned on, the level at the first gate node N1 is the same as that at the third gate node N3, that is, the level at the first gate node N1 is VGH, and the eighth gate transistor K8 is turned off. Since the first gate clock signal CK is at the low level, the first gate transistor K1 is turned on, the level at the second gate node N2 is VGL-Vth1, both the third gate transistor K3 and the fourth gate transistor K4 are turned on, and the high level signal VGH is output as the gate output signal GOUT via the third gate transistor K3, that is, the gate output signal is the high level signal VGH.

In a second sub-stage t42 of the stabilization stage t4, the first gate clock signal is at a high level, the second gate clock signal is at a low level, and the input signal SKT is at a high level. The levels at both the first gate node N1 and the third gate node N3 are VGH, and both the eighth gate transistor K8 and the seventh gate transistor K7 are turned off. Since the first gate clock signal CK is at the high level, both the second gate transistor K2 and the first gate transistor K1 are turned off. Due to voltage holding of the first gate capacitor C1, the level at the second gate node N2 is still VGL-Vth1, both the third gate transistor K3 and the fourth gate transistor K4 are turned on, and the high level signal VGH is output as the gate output signal GOUT via the third gate transistor K3, that is, the gate output signal is the high level signal VGH.

In the second sub-stage t42, since the second gate clock signal CB is at the low level, the fifth gate transistor K5 is turned on, and thus the high level signal VGH is transmitted to the third gate node N3 and the first gate node N1 via the fourth gate transistor K4 and the fifth gate transistor K5, so that the levels at both the first gate node N1 and the third gate node N3 are maintained at a high level.

In a third sub-stage t43 of the stabilization stage t4, both the first gate clock signal CK and the second gate clock signal CB are at a high level, and the input signal SKT is at a high level. The levels at both the first gate node N1 and the third gate node N3 are VGH, and the eighth gate transistor K8 and the seventh gate transistor K7 are turned off. Since the first gate clock signal CK is at the high level, both the second gate transistor K2 and the first gate transistor K1 are turned off, the level at the second gate node N2 is still VGL−Vth1, and both the third gate transistor K3 and the fourth gate transistor K4 are turned on. The high level signal VGH is output as the gate output signal GOUT via the third gate transistor K3, i.e., the gate output signal is the high level signal VGH.

In some embodiments, the display region 91 is further provided with a plurality of control electrode lines 13 extending in the second direction 992, each of the control electrode lines 13 is coupled to multiple sub-pixels 1.

The driving units 4 are control electrode driving units 42.

The second half region is provided with a plurality of control electrode driving units 42 configured to supply a control electrode driving signal to the plurality of control electrode lines 13.

Referring to FIGS. 1, 2, 4 and 5, the display region 91 may be further provided with control electrode lines 13 extending along the second direction 992, and each of the control electrode lines 13 may also be coupled to one or two rows of sub-pixels 1, and in particular a control electrode line 13 may be coupled to the control electrode line terminal EM of the above 7T1C pixel circuit.

Since the control electrode lines 13 also extend along the second direction 992, all the control electrode lines 13 correspond to the driving units 4 in the second half-region (i.e., the right semicircular annulus in FIGS. 1 and 2, or the right U-shaped annulus in FIGS. 4 and 5), and therefore, the driving units 4 in the second half-region may be provided with the control electrode driving units 42 for providing a control electrode driving signal to the plurality of control electrode lines 13 (further, each of the driving units 4 in the second half-region 922 may be the control electrode driving unit 42), so that the control electrode driving units 42 are coupled to corresponding control lines 13 nearby.

Thus, referring to FIGS. 1, 2, 4, and 5, in the circuit region 92 of the display substrate according to the embodiment of the present disclosure, the testing units 3 and the gate driving units 41 are mixed in arranged in an upper left region, the testing units 3 and the control electrode driving units 42 are mixed in arranged in an upper right region, the multiplexing units 2 and the gate driving units 41 are mixed in arranged in a lower left region, and the multiplexing units 2 and the control electrode driving units 42 are mixed in arranged in a lower right region.

Referring to FIGS. 1 and 2, since an annulus has different radial directions at different positions of the annulus, the units arranged in the annulus may also be "rotated" with different arrangement positions, and generally, output terminals of the units are always ensured to face a center of a circle as edges of the annulus.

In addition, referring to FIGS. 4 and 5, the units arranged corresponding to the above "arc boundary" may also be "rotated" with different arrangement positions, and generally, output terminals of the units is always ensured to face a center of a circle a part of which is the arc boundary.

Of course, it will be appreciated that, the units and the sub-pixels 1 in FIGS. 1, 2, 4 and 5 is merely schematically shown as a rectangle. However, in practice, each of the units and the sub-pixels 1 is constituted of a plurality of elements, and a region occupied by each of the units and the sub-pixels 1 is not necessarily of a rectangle.

Of course, it will be appreciated that, for an actual display substrate, each of the units occupies only a small region of an annulus region, so that in some subsequent drawings, many structures of each of the units at partial region may be approximately simplified as straight lines.

Of course, it should be appreciated that, in many drawings of the embodiments of the present disclosure, due to the limitation of an area of the display substrate, a shape, a size, a size ratio, a number, a number ratio, positions, and the like of various structures of the sub-pixel 1, such as lines (e.g., signal lines), joints, units, regions, and the like, are only illustrative and not restrictive. For example, the actual number of testing signal lines 63, driving signal lines 64, and the like should be more than those shown in FIGS. 1, 2, 4, and 5.

Of course, the above specific form of the driving units 4 is not a limitation to the embodiment of the present disclosure.

For example, all the driving units 4 in both the two half regions may be the gate driving units 41 and respectively provide the gate driving signal for different gate lines 12, or provide the gate driving signal for each of the gate lines 12 from both sides of each of the gate lines 12 (i.e., in double-side driving mode).

Specifically, each of the control electrode driving units 42 may be a control electrode shift register (EM GOA). A plurality of control electrode shift registers are cascaded, so that the plurality of control electrode shift registers may respectively provide a driving signal to the plurality of control electrode lines 13.

The control electrode shift register may be of various specific forms. Exemplarily, a circuit structure and a driving timing of the control electrode shift register may refer to FIGS. 11 and 12. Hereinafter, a low level of the signal may be equal to a low level signal VGL, and a high level of the signal may be equal to a high level signal VGH.

In a first stage P1, a first control electrode clock signal CK' is at a low level, so that a first control electrode transistor M1 and a third control electrode transistor M3 are turned on. A high level start signal ESTV is transmitted to a first control electrode node N1' via the turned-on first control electrode transistor M1, so that a level at the first control electrode node N1' is changed to a high level, and thus a second control electrode transistor M2, an eighth control electrode transistor M8 and a tenth control electrode transistor M10 are turned off. In addition, the low level signal VGL is transmitted to the second control electrode node N2' via the turned-on third control electrode transistor M3, so that a level at the second control electrode node N2' is changed to a low level, and thus a fifth control electrode transistor M5 and a sixth control electrode transistor M6 are turned on. Since a second control electrode clock signal CB' is at a high level, a seventh control electrode transistor M7 is turned off. In addition, a level at a fourth control electrode node N4' may be maintained at a high level due to charge storage of a third control electrode capacitance C3', so that a ninth control electrode transistor M9 is turned off. In the first stage P1, since both the ninth control electrode transistor M9 and the tenth control electrode transistor M10 are turned off, a control electrode output signal EMOUT is maintained at a previous low level.

In a second stage P2, the second control electrode clock signal CB' is at a low level, and thus a fourth control electrode transistor M4 and the seventh control electrode transistor M7 are turned on. Since the first control electrode clock signal CK' is at a high level, the first control electrode transistor M1 and the third control electrode transistor M3 are turned off. The second control electrode node N2' may continue to be maintained at a low level of a previous stage due to charge storage of a first control electrode capacitor C1', so that the fifth control electrode transistor M5 and the sixth control electrode transistor M6 are turned on. The high level signal VGH is transmitted to the first control electrode node N1' via the turned-on fifth and fourth control electrode transistors M5 and M4, so that the level at the first control electrode node N1' is maintained at a high level of a previous stage, and thus the second control electrode transistor M2, the eighth control electrode transistor M8, and the tenth control electrode transistor M10 are turned off. In addition, the second control electrode clock signal CB' of the low level is transmitted to the fourth control electrode node N4' via the turned-on sixth and seventh control electrode transistor M6 and M7, so that a level at the fourth control electrode node N4' is changed to a low level, and thus the ninth control electrode transistor M9 is turned on. The high level signal VGH is output via the turned-on ninth control electrode transistor M9, and thus the control electrode output signal EMOUT is a high level.

In a third stage P3, since the first control electrode clock signal CK' is at a low level, the first control electrode transistor M1 and the third control electrode transistor M3 are turned on. Since the second control electrode clock signal CB' is at a high level, the fourth control electrode transistor M4 and the seventh control electrode transistor M7 are turned off. Due to charge storage of a third control electrode capacitor C3', a level at the fourth control electrode node N4' may be maintained at a low level in a previous stage, so that the ninth control electrode transistor M9 is maintained to be turned on. The turned-on ninth control electrode transistor M9 outputs the high level signal VGH, so that the control electrode output signal EMOUT is still at the high level.

In a fourth stage P4, since the first control electrode clock signal CK' is at a high level, the first control electrode transistor M1 and the third control electrode transistor M3 are turned off. Since the second control electrode clock signal CB' is at a low level, the fourth control electrode transistor M4 and the seventh control electrode transistor M7 are turned on. Due to charge storage of a second control electrode capacitor C2', the level at the first control electrode node N1' is maintained at a high level of a previous stage, so that the second control electrode transistor M2, the eighth control electrode transistor M8, and the tenth control electrode transistor M10 are turned off. Due to the charge storage of the first control electrode capacitor C1', the second control electrode node N2 continues to be maintained at the low level in a previous stage, so that the fifth control electrode transistor M5 and the sixth control electrode transistor M6 are turned on. In addition, the second control electrode clock signal CB' of the low level is transmitted to the fourth control electrode node N4' via the turned-on sixth control electrode transistor M6 and the turned-on seventh control electrode transistor M7, so that the level at the fourth control electrode node N4' is changed to a low level, and thus the ninth control electrode transistor M9 is turned on. The high level signal VGH is output via the turned-on ninth control electrode transistor M9, and thus the control electrode output signal EMOUT is still maintained at the high level.

In a fifth stage P5, since the first control electrode clock signal CK' is at a low level, the first control electrode transistor M1 and the third control electrode transistor M3 are turned on. Since the second control electrode clock signal CB' is at a high level, the fourth control electrode transistor M4 and the seventh control electrode transistor M7 are turned off. The start signal ESTV of a low level is transmitted to the first control electrode node N1' via the turned-on first control electrode transistor M1, so that the level at the first control electrode node N1' is changed to a low level, and thus the second control electrode transistor M2, the eighth control electrode transistor M8, and the tenth control electrode transistor M10 are turned on. The first control electrode clock signal CK' of a low level is transmitted to the second control electrode node N2' via the turned-on second control electrode transistor M2, so that the level at the second control electrode node N2' may be further lowered. Therefore, the second control electrode node N2' continues to be maintained at the low level of a previous stage, so that the fifth control electrode transistor M5 and the sixth control electrode transistor M6 are turned on. In addition, the high level signal VGH is transmitted to the fourth control electrode node N4' via the turned-on eighth control electrode transistor M8, so that the level at the fourth control electrode node N4' is changed to a high level, and thus the ninth control electrode transistor M9 is turned off. Since the low level signal VGL is output via the turned on tenth control electrode transistor M10, the control electrode output signal EMOUT is changed to a low level.

In some embodiments, the multiplexing signal lines 62 include a plurality of multiplexing control lines 621 and a plurality of multiplexing data lines 622.

At least one of the multiplexing units 2 includes a plurality of multiplexing transistors 21. A gate of each of the plurality of multiplexing transistor 21 is coupled to one multiplexing control line 621, a first electrode is coupled to one data line 11, and a second electrode is coupled to one multiplexing data line 622.

The second electrodes of all multiplexing transistors 21 in a same multiplexing unit 2 are coupled to a same multiplexing data line 621, and the second electrodes of the multiplexing transistors 21 in different multiplexing units 2 are coupled to different multiplexing data lines 622.

Figure 6:
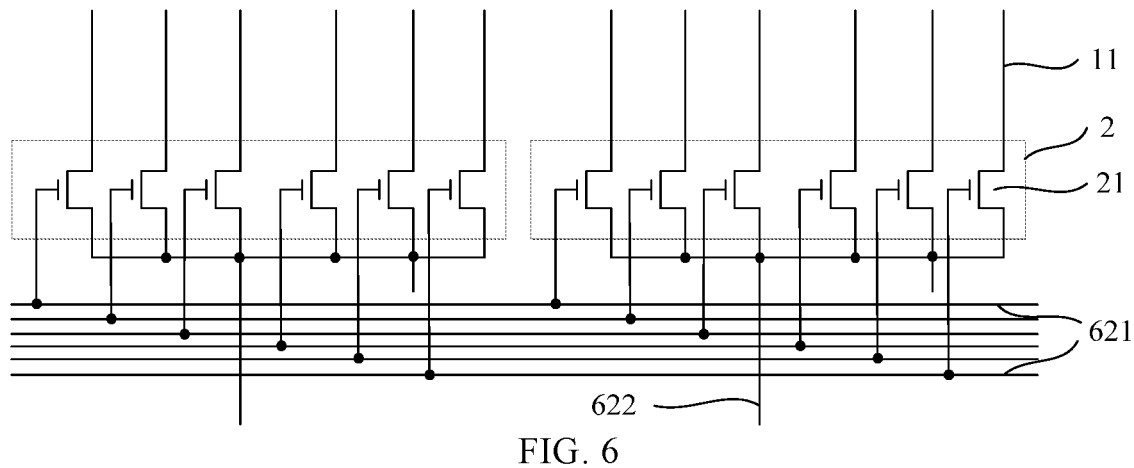
FIG. 6 is a schematic diagram illustrating a circuit of a multiplexing unit in a display substrate according to an embodiment of the present disclosure.

Referring to FIGS. 1, 2, 4, 5 and 6, the multiplexing signal lines 62 include multiplexing control lines 621 and multiplexing data lines 622, and each of the multiplexing units 2 includes a plurality of multiplexing transistors 21 (six transistors 21 shown in FIG. 6 as an example). A gate of each of the multiplexing transistors 21 is coupled to the multiplexing control line 621, a first electrode of each of the multiplexing transistors 21 is coupled to the data line 11, and a second electrode of each of the multiplexing transistors 21 is coupled to the multiplexing data line 622. And, a same multiplexing unit 2 is coupled to a same multiplexing data line 622, and different multiplexing units 2 are coupled to different multiplexing data lines 622.

Thus, referring to FIG. 6, when displaying, ON signals (signals capable of turning on transistors) may be in turn input to one of the plurality of multiplexing control lines 621, and OFF signals (signals capable of turning off transistors) are input to the other of the plurality of multiplexing control lines 621, such that one multiplexing data line 622 is alternately communicating with different data lines 11 via the plurality of multiplexing transistors 21 in one multiplexing unit 2, thereby providing required data signals to multiple data lines 11 via one multiplexing data line 622 respectively. That is, control of the plurality of data lines 11 by one signal source (e.g., via the joints 6) (i.e., "one driving many", e.g., one driving six) is achieved, thereby making the number of signal sources providing signals to the data lines 11 much smaller than the number of data lines 11, so as to simplify a product structure, e.g., to reduce the number of required driving chips.

In view of simplifying structures, the number of the multiplexing control lines 621 may be equal to the number of the multiplexing transistors 21 in each of the multiplexing units 2 (e.g., the multiplexing control lines 621 includes six multiplexing control lines, and the multiplexing transistors 21 in each of the multiplexing units 2 includes six multiplexing transistors 21), that is, the multiplexing transistors 21 in each of the multiplexing units 2 may be coupled to different multiplexing control lines 621 respectively, and each of the multiplexing control lines 621 is coupled to a corresponding one multiplexing transistor 21 in each of the multiplexing units 2.

Since the multiplexing control line 621 needs to be coupled to multiple multiplexing units 2, the multiplexing control line 621 may have a portion extending along a circumferential direction of the fan-out region 93. Different parts of the portion are coupled to different multiplexing units 2 respectively. Each of the multiplexing data lines 622 is coupled to only one multiplexing unit 2, and thus each of the multiplexing data lines 622 may be directly coupled to corresponding multiplexing unit 2 across the fan-out region 93.

Obviously, based on the above structure, a small number of multiplexing data lines 621 is located at positions in the fan-out region 93 along a circumferential direction of the fan-out region 93 farther from a connection sub-region 923, and thus the fan-out region 93 may have a smaller size.

In some embodiments, the testing signal lines 63 include testing control lines 631 and testing data lines 632.

At least one testing unit 3 includes a plurality of testing transistors 31. A gate of each of the testing transistors 31 is coupled to one testing control line 631, a first electrode of each of the testing transistors 31 is coupled to one data line 11, and a second electrode of each of the testing transistors 31 is coupled to one testing data line 632.

Each of the testing data lines 632 is coupled to the plurality of testing units 3.

Referring to FIGS. 1, 2, 4, 5, 7 and 8, the testing signal lines 63 include testing control lines 631 and testing data lines 632. Correspondingly, each of the testing units 3 may include a plurality of testing transistors 31. A gate of each of the testing transistors 31 is coupled to the testing control line 631, a first electrode of each of the testing transistors 31 is coupled to the data line 11, and a second electrode of each of the testing transistors 31 is coupled to the testing data line 632. Thus, by applying ON signals to the testing control lines 631, signals in the testing data lines 632 may be input correspondingly to the plurality of data lines 11 via the testing transistors 31 in different testing units, so as to achieve detection of the display device.

Since each of the testing data lines 632 is coupled to the plurality of testing units 3, the number of the testing data lines 632 is much smaller than the number of the testing units 3. Therefore, although the testing units 3 are located away from the joint region 94, since control of the testing units 3 may be achieved by only a few testing signal lines 63 extending to the testing units 3, the a few testing signal lines 63 do not occupy a large layout area.

The correspondence relationship between the testing data lines 632, the testing control lines 631, and the testing units 3 may be various.

Figure 7:
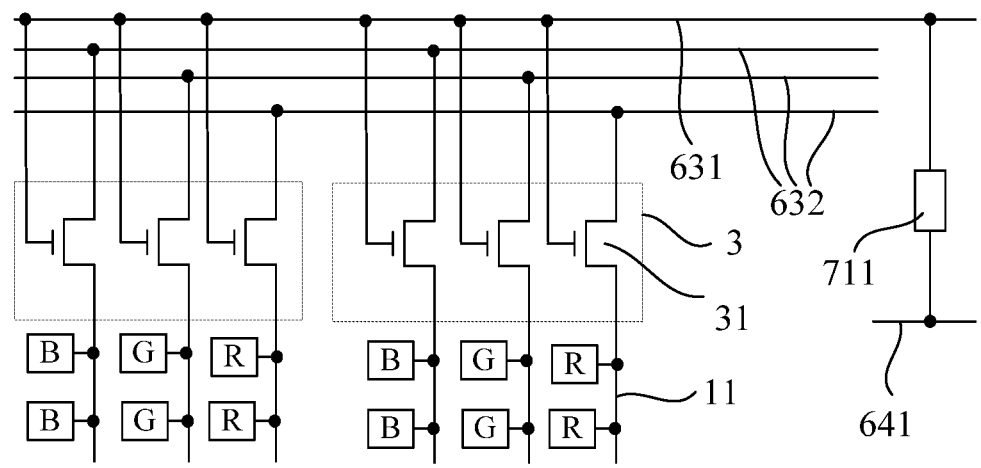
FIG. 7 is a schematic diagram illustrating a circuit of a testing unit in a display substrate according to an embodiment of the present disclosure.

For example, referring to FIG. 7, the number of the testing data lines 632 may be equal to the number of the testing transistors 31 in each of the testing units 3 (e.g., the number of the testing data lines 632 is three, and the number of the testing transistors 31 in each of the testing units 3 is three), and the number of the testing control lines 631 is only one. That is, each of the testing data lines 632 is coupled to a second electrode of one testing transistor 31 in each of the testing units 3, first electrodes of different testing transistors 31 are coupled to different data lines 11, and gates of all the testing transistors 31 of all the testing units 3 are coupled to the one testing control line 631.

In this case, referring to FIG. 7, the color of the sub-pixels 1 coupled to each of the data lines 11 may be the same (in the drawing, R represents a red sub-pixel 1, G represents a green sub-pixel 1, and B represents a blue sub-pixel 1), and the color of the sub-pixels 1 coupled to the data line 11 corresponding to each of the testing data line 632 is the same. Therefore, a same testing signal is consecutively applied to the testing data lines 632, so that the sub-pixels 1 of a same color may display a same brightness (for example, an overall display of a white picture or other monochrome pictures), to facilitate to position poor sub-pixels 1.

Figure 8:
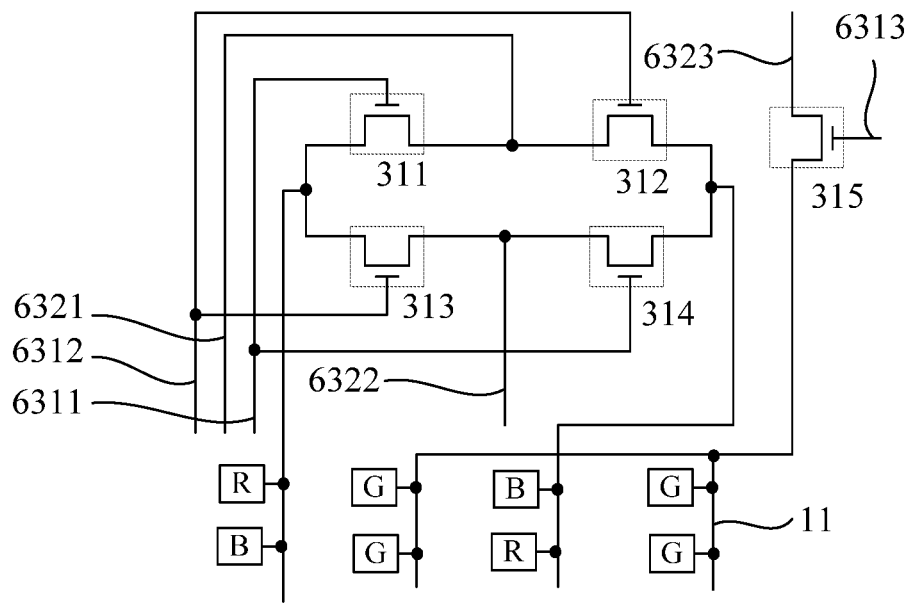
FIG. 8 is a schematic diagram illustrating a circuit of a testing unit in a display substrate according to an embodiment of the present disclosure.

For another example, the colors of the sub-pixels 1 coupled to each of the data lines 11 may be different. Referring to FIG. 8, each four columns of sub-pixels 1 include two columns of green sub-pixels 1, and the other two columns of sub-pixels in each of which the red and blue sub-pixels 1 are alternately arranged. In the two columns of sub-pixels 1 other than the two columns of green sub-pixels 1, any two adjacent sub-pixels 1 in any same row are blue and red, respectively.

Further, referring to FIG. 8, three testing data lines 632, three testing control lines 631 and five testing transistors 31 in each of the testing units 3 are shown for controlling four data lines 11 (corresponding to the above four columns of sub-pixels 1). First electrodes of a first testing transistor 311 and a third testing transistor 313 of each of the testing units 3 are coupled to one column of sub-pixels 1 in which the red and blue sub-pixels 1 are alternately arranged. First electrodes of a second testing transistor 312 and a fourth testing transistor 314 of each of the testing units 3 are coupled to the other column of sub-pixels 1 in which the red and blue sub-pixels 1 are alternately arranged. Second electrodes of the first testing transistor 311 and the second testing transistor 312 are coupled to a first testing data line 6321. Second electrodes of the third testing transistor 313 and the fourth testing transistor 314 are coupled to a second testing data line 6322. Gates of the first testing transistor 311 and the fourth testing transistor 314 are coupled to a first testing control line 6311. Gates of the second testing transistor 312 and the third testing transistor 313 are coupled to a second testing control line 6312. A gate of the fifth testing transistor 315 is coupled to a third testing control line 6313, a first electrode of the fifth testing transistor 315 is coupled to two columns of green sub-pixels 1, and a second electrode of the fifth testing transistor 315 is coupled to a third testing data line 6323.

As can be seen from the above arrangement, by providing the ON signals in turn to the first testing control line 6311 and the second testing control line 6312, the blue and red sub-pixels 1 may be controlled by the first testing data line 6321 and the second testing data line 6322 respectively, while all the green sub-pixels 1 may be controlled by the third testing control line 6313 and the third testing data line 6323, so that the sub-pixels 1 of the same color may display the same brightness.

In some embodiments, the testing signal lines 63 are on a side of the circuit region 92 distal to the display region 91, and the driving signal lines 64 are on a side of the circuit region 92 distal to the display region 91.

Referring to FIGS. 1, 2, 4, 5 and 13, in order to facilitate to be coupled to corresponding units, the testing signal lines 63 and the driving signal lines 64 may be arranged along a side of (outside) the circuit region 92 distal to the display region 91. Of course, since the fan-out region 93 is also outside the circuit region 92, the testing signal lines 63 and the driving signal lines 64 are also partially in the fan-out region 93.

The specific number of the testing signal lines 63 and the driving signal lines 64 may be determined according to different forms of their corresponding units.

For example, when the testing unit 3 is of a form as shown in FIG. 7, the testing signal lines 63 may include three testing data lines 632 and one testing control line 631, i.e., a total of four testing signal lines 63 are arranged around the outside of the circuit region 92.

Figure 9:
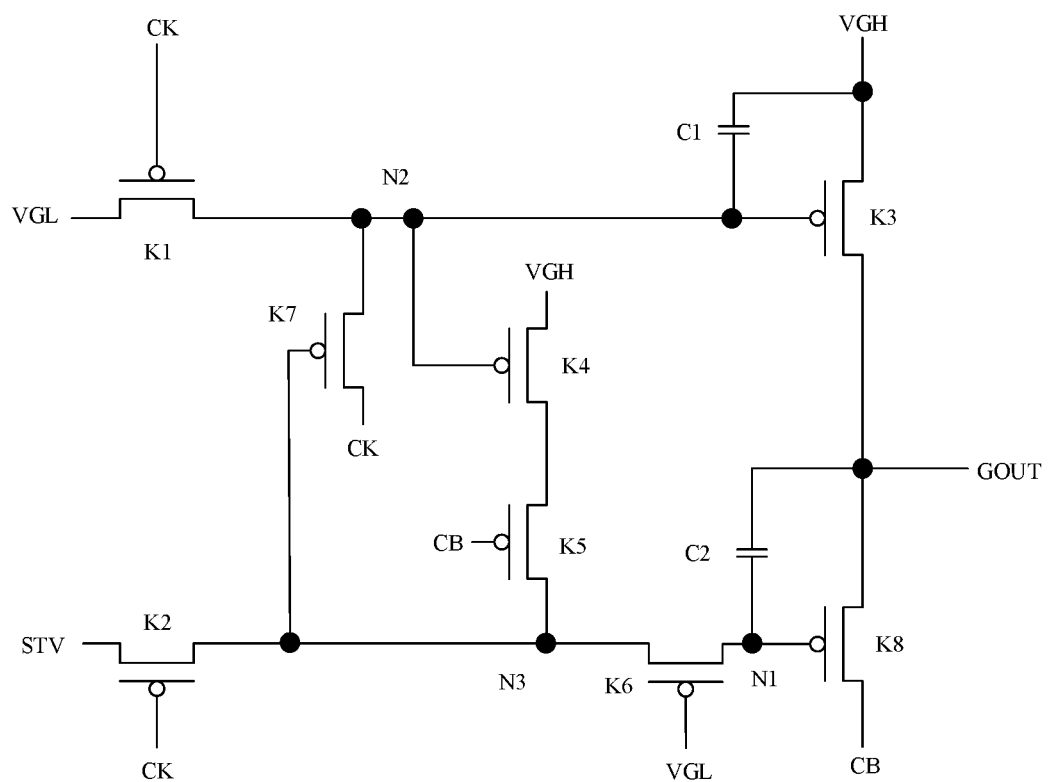
FIG. 9 is a circuit diagram of a gate shift register in a display substrate according to an embodiment of the present disclosure.
Figure 10:
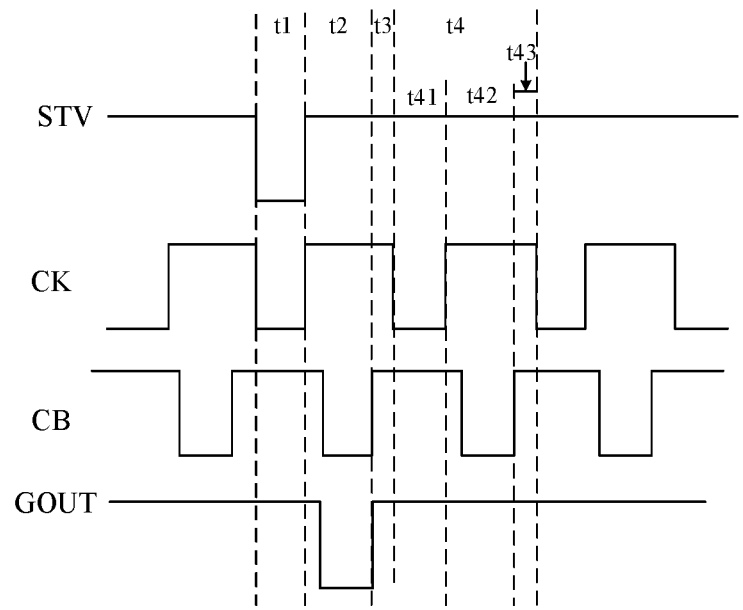
FIG. 10 is a timing diagram for driving a gate shift register in a display substrate according to an embodiment of the present disclosure.

For another example, when the gate driving unit 41 is of a form as shown in FIG. 9, four corresponding driving signal lines 64 may be needed respectively for transmitting the first gate clock signal CK, the second gate clock signal CB, the high level signal VGH, and the low level signal VGL.

Figure 11:
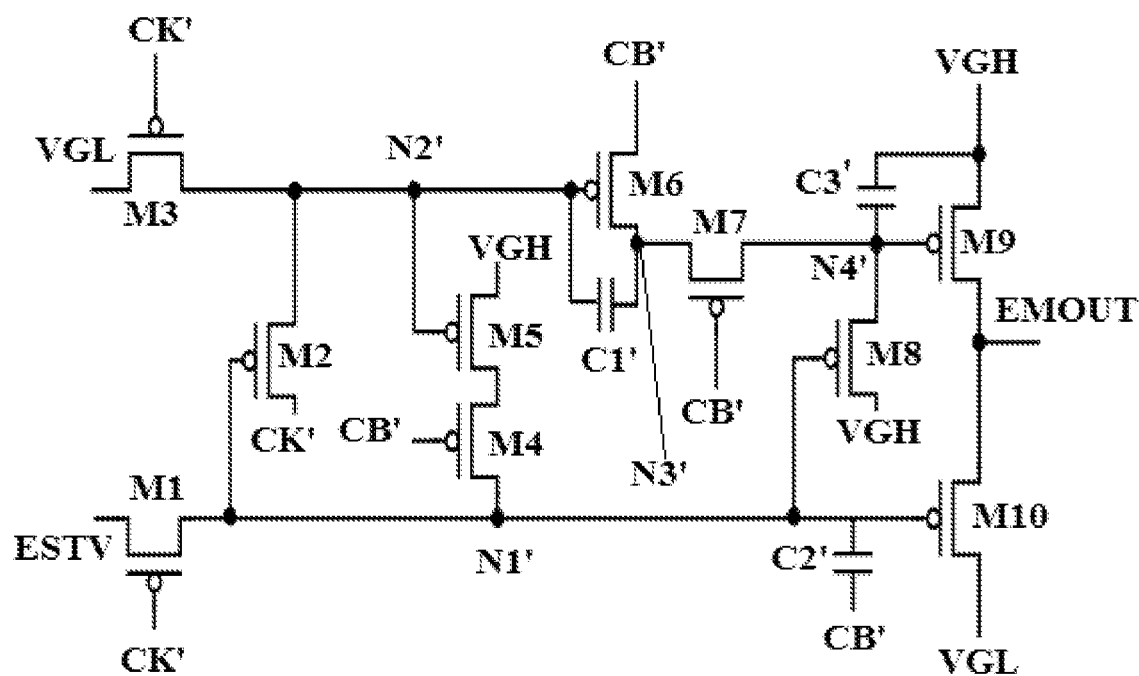
FIG. 11 is a circuit diagram of a control electrode shift register in a display substrate according to an embodiment of the present disclosure.
Figure 12:
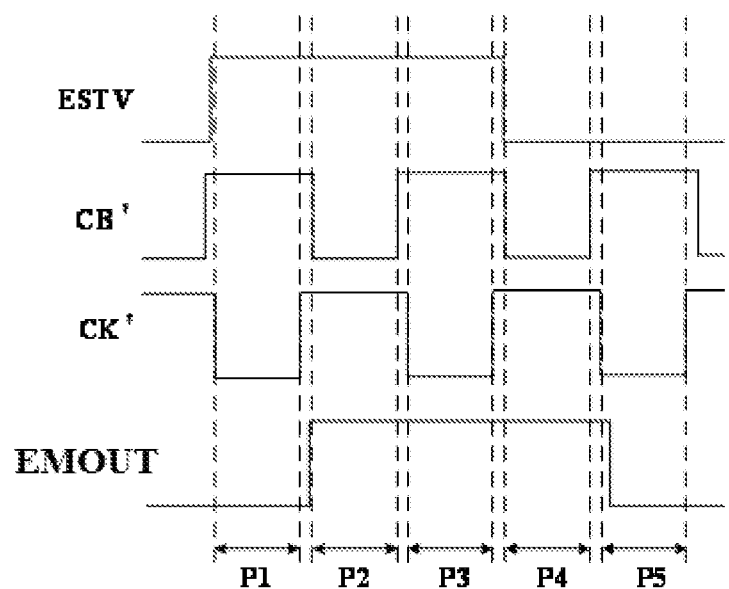
FIG. 12 is a timing diagram for driving a control electrode shift register in a display substrate according to an embodiment of the present disclosure.

For another example, when the control electrode driving unit 42 is of a form as shown in FIG. 11, four corresponding driving signal lines 64 may be needed respectively for transmitting the first control electrode clock signal CK', the second control electrode clock signal CB', the high level signal VGH, and the low level signal VGL.

Since the first gate clock signal CK, the second gate clock signal CB, the first control electrode clock signal CK', and the second control electrode clock signal CB' are different from each other, they may be coupled to corresponding four different driving signal lines 64. Since the high level signal VGH and the low level signal VGL for the gate driving units 41 and the control electrode driving units 42 may be respectively the same, the high level signal VGH for all the units may be transmitted via one driving signal line 64 (e.g., a high level line 641), and the low level signal VGL for all the units may be transmitted via one driving signal line 64 (e.g., a low level line 642). Of course, the high level line 641 and the low level line 642 should be distributed at positions outside the first half region and the second half region of the circuit region 92.

Exemplarily, referring to FIGS. 1, 2, 4, 5, and 13, the above testing signal lines 63 may be on a side of (outside) the driving signal lines 64 distal to the display region 91.

In some embodiments, ends of the first sub-region 921 closest to the second sub-region 922 are closer to the display region 91 than ends of the second sub-region 922 closest to the first sub-region 921.

Figure 13:
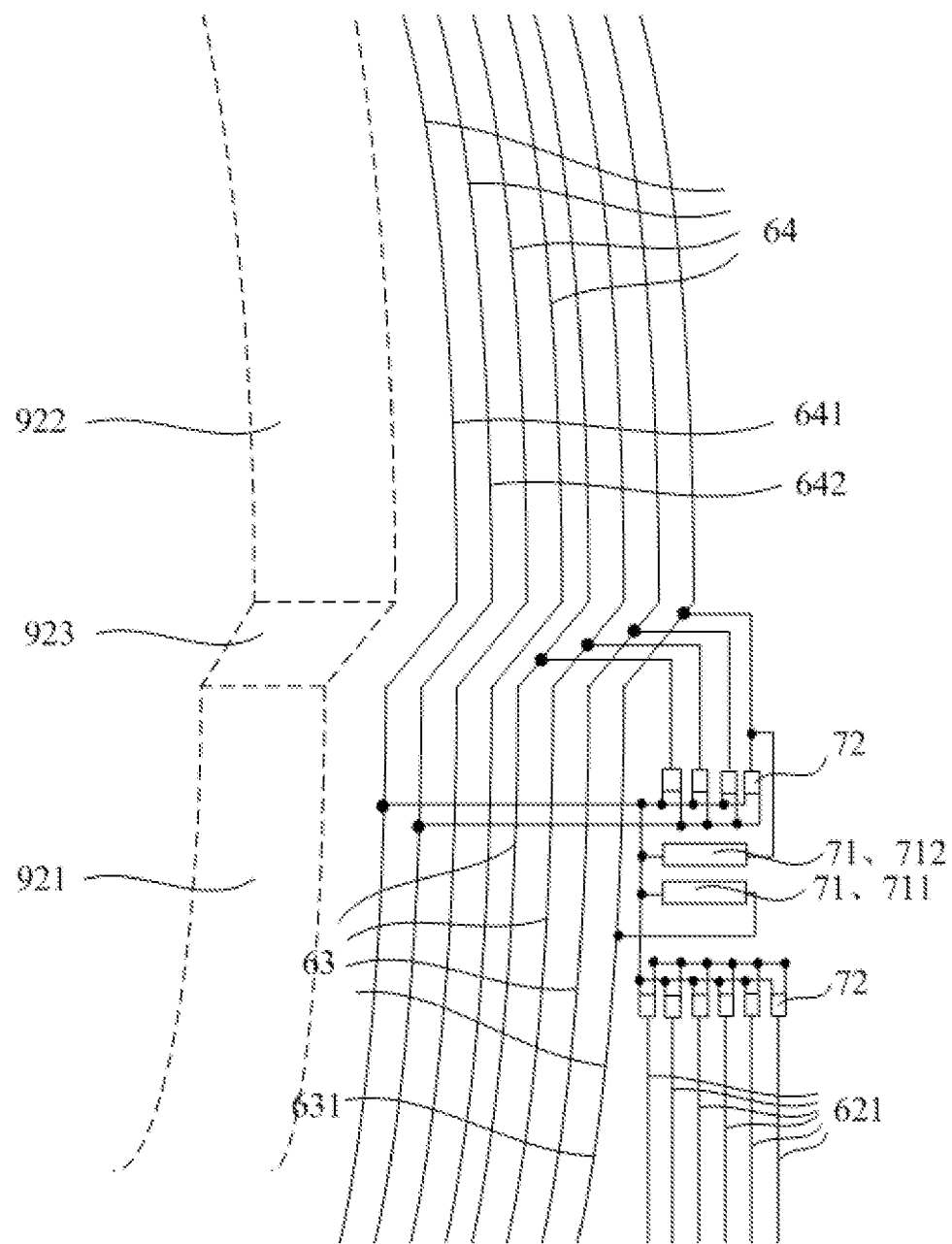
FIG. 13 is a schematic diagram illustrating a partial structure at a connection sub-region of a display substrate according to an embodiment of the present disclosure.

Referring to FIGS. 1, 2 and 13, since an inner side of the second sub-region 922 is further provided with the capacitor region 95, and an inner side of the first sub-region 921 is provided with the display region 91, the first sub-region 921 may be "further inside (further closer to the display region 91)" than the second sub-region 922. Therefore, the first sub-region 921 is also "further inside" than the second sub-region 922 at adjacent ends of the two sub-regions. For example, a radius (one half of an inner or external diameter) of the first semicircular annulus may be smaller than that of the second semicircular annulus.

Of course, when the first sub-region 921 and the second sub-region 922 do not include the above "arc region" but include regions of any other shape, the term "radius" may not be used to describe the first and second sub-regions, but their ends may still satisfy the above positional relationship, i.e., the first sub-region 921 may still be "smaller" than the second sub-region 922.

In some embodiments, the circuit region 92 further includes: connection sub-regions 923 connecting the ends of the first sub-region 921 closest to the second sub-region 922 and the ends of the second sub-region 922 closest to the first sub-region 921 respectively.

Referring to FIG. 13, the ends of the first sub-region 921 are "further inside" than the ends of the second sub-region 922, so that the ends of the first sub-region 921 are not "aligned" with the ends of the second sub-section 922, and the connection sub-regions 923 obliquely arranged may be needed to connect the first sub-region 921 and the second sub-region 922.

It should be understood that the connection sub-regions 923 also belong to the circuit region 92, and the driving units 4 may also be provided in the connection sub-regions 923. However, since the connection sub-regions 923 are not the first sub-region 921 or the second sub-region 922, there is no multiplexing unit 2 and no testing power supply. However, for the sake of structural regularity, structures in the connection sub-region 923 should be as simple as possible, for example, only including necessary lines (such as, lines for cascading different driving units 4).

Meanwhile, correspondingly, for the sake of structural regularity, the testing signal lines 63 and the driving signal lines 64 outside the circuit region 92 may also be bent at corresponding connection sub-region 923, so as to ensure substantially unchanged distances between the test signal line 63 and the circuit region 92, and between the driving signal line 64 and the circuit region 92.

In some embodiments, the display substrate in the embodiment of the present disclosure further includes: at least one polysilicon resistor 71. Each of the at least one polysilicon resistor 71 is between and coupled to two signal lines. The polysilicon resistor 71 is on a side of the ends of the first sub-region 921 closest to the second sub-region 922, distal to the display region 91, or on a side of the connection sub-region 923 distal to the display region 91.

The polysilicon resistor 71 is also called a "poly resistor", which is a resistor made of polysilicon (p-Si) material having a relatively large resistance. The polysilicon resistor 71 achieves connection between different signal lines, so that when there is no signal in one signal line, the signal in the other signal line may reach the one signal line to some extent after delay, thereby avoiding signal fluctuation in the signal lines due to floating. Meanwhile, when there is a signal in both the two signal lines, since the polysilicon resistor 71 has a large resistance, the two signal lines are not short-circuited, and the signals in the two signal lines are not affected by each other.

In order to achieve a resistance as large as possible in a layout area as small as possible, the polysilicon resistor 71 may be of a structure formed by bending the polysilicon material with a shape of a line in a small region.

As mentioned above, the ends of the first sub-region 921 is "further inside" than the ends of the second sub-region 922, so that the ends of the first sub-region 921 and outer sides of the connection sub-region 923 relatively "reserve" a certain space where polysilicon resistors 71 may be located, referring to FIGS. 1, 2 and 13. For example, the ends of the first sub-region 921 at two sides (left and right sides in FIGS. 1 and 2) of the display substrate along the second direction 992 and the outer sides of the connection sub-regions 923 may be provided with the polysilicon resistors 71.

In some embodiments, the test signal lines 63 are on a side of the circuit region 92 distal to the display region 91.

The driving signal lines 64 are on a side of the circuit region 92 distal to the display region 91.

The polysilicon resistors 71 are on a side of the testing signal lines 63 and the driving signal lines 64 distal to the display region 91.

Referring to FIGS. 1, 2 and 13, when the testing signal line 63 and the driving signal lines 64 are also outside the circuit region 92, the polysilicon resistors 71 may be provided outside the signal lines to prevent the polysilicon resistors 71 from affecting the connection between the signal lines and corresponding units in the circuit region 92.

In some embodiments, the display substrate in the embodiments of the present disclosure further includes: at least one electrostatic discharge unit 72. Each of the at least one electrostatic discharge unit 72 is coupled to one signal line, and is configured to discharge static electricity in the signal line to which it is coupled. The electrostatic discharge unit 72 is on a side of the ends of the first sub-region 921 closest to the second sub-region 922, distal to the display region 91, or is on a side of the connection sub-region 923 distal to the display region 91.

In order to prevent the signal lines from being damaged by discharge breakdown due to accumulation of static electricity in the signal lines, electrostatic discharge units 72 (ESD) may be further provided to discharge the static electricity accumulated in the signal lines, thereby protecting the signal lines.

As mentioned above, the ends of the first sub-region 921 are "further inside" than the ends of the second sub-region 922, so that the ends of the first sub-region 921 and the outer side of the connection sub-region 923 relatively "reserve" a certain space where the electrostatic discharge units 72 may be located, referring to FIGS. 1, 2 and 13. For example, the ends of the first sub-region 921 at two sides (left and right sides in FIGS. 1 and 2) of the display substrate along the second direction 992 and the outer sides of the connection sub-region 923 may be provided with the electrostatic discharge units 72.

The region occupied by the polysilicon resistors 71 and the electrostatic discharge units 72 should not exceed the region defined by the position difference between the ends of the first sub-region 921 and the ends of the second sub-region 922, for example, a size of each of the polysilicon resistors 71 and the electrostatic discharge units 72 may be in a range from 100 μm to 150 μm.

Of course, even when the size of the first sub-region 921 is not smaller than the size of the second sub-region 922 (e.g., the sub-region includes a U-shaped region), referring to FIG. 4, the polysilicon resistors 71 and the electrostatic discharge units 72 may be arranged outside the boundary between the first sub-region 921 and the second sub-region 922.

It should be understood that the polysilicon resistors 71 (e.g., first polysilicon resistors 711 and second polysilicon resistors 712) shown in the circuit diagrams (e.g., FIGS. 7 and 16) in the embodiments of the present disclosure only represent electrical connection structures of the polysilicon resistors 71, and do not represent physical position relationship between the polysilicon resistors 71 and other units.

In some embodiments, the testing signal lines 63 are on a side of the circuit region 92 distal to the display region 91.

The driving signal lines 64 are on a side of the circuit region 92 distal to the display region 91.

The electrostatic discharge units 72 are on a side of the testing signal lines 63 and the driving signal lines 64 distal to the display region 91.

Referring to FIGS. 1, 2, 4, 5 and 13, when the testing signal lines 63 and the driving signal lines 64 are outside the circuit region 92, the electrostatic discharge units 72 may also be outside the signal lines to prevent the electrostatic discharge units 72 from affecting the connection between the signal lines and corresponding units in the circuit region 92.

In some embodiments, the multiplexing signal lines 62 include a plurality of multiplexing control lines 621 and a plurality of multiplexing data lines 621. The signal line to which each of the electrostatic discharge units 72 is coupled is the testing signal line 63 or the multiplexing control line 621.

Referring to FIG. 13, there may be a plurality of electrostatic discharge units 72, which are coupled to and protects the above testing signal lines 63 (e.g., four testing signal lines 63) and the multiplexing control lines 621 (e.g., six multiplexing control lines 621), respectively.

In some embodiments, the driving signal lines 64 include a high level line 641 and a low level line 642. The high level line 641 is configured to be coupled to a high level signal source, and the low level line 642 is configured to be coupled to a low level signal source.

Each of the electrostatic discharge units 72 includes a first discharge transistor 721 and a second discharge transistor 722. A gate and a first electrode of the first discharge transistor 721 are coupled to the high level line 641, and a second electrode of the first discharge transistor 721 is coupled to a signal line (the testing signal line 63 or the multiplexing control line 621) corresponding to the electrostatic discharge unit 72. A gate and a first electrode of the second discharge transistor 722 are coupled to a signal line corresponding to the electrostatic discharge unit 72, and a second electrode of the second discharge transistor 722 is coupled to the low level line 642.

Figure 16:
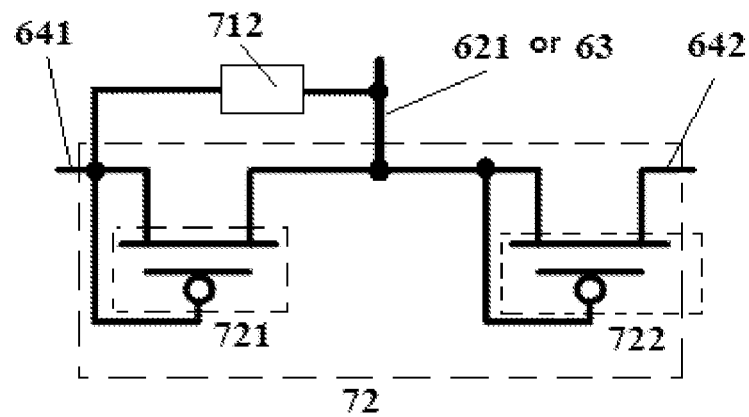
FIG. 16 is a schematic diagram illustrating a circuit of an electrostatic discharge unit in a display substrate according to an embodiment of the present disclosure.

Referring to FIGS. 13 and 16, as a form of the embodiment of the present disclosure, the electrostatic discharge unit 72 may include two discharge transistors. One electrode and a gate of each of the two discharge transistors are coupled to each other, thereby forming an equivalent diode connection. A signal line to be protected is between and respectively coupled to two terminals of two "diodes" formed by the two discharge transistors. The other two terminals of the two "diodes" are coupled to the above high level line 641 (for transmitting the high level signal VGH) and the low level line 642 (for transmitting the low level signal VGL), respectively. Thus, when an instantaneous high voltage (e.g., 100V) occurs in the signal line due to accumulation of positive charges, the "diode" in the first discharge transistor 721 is turned on, thereby discharging the positive charges in the signal line. When an instantaneous low voltage (e.g., −100V) occurs in the signal line due to accumulation of negative charges, the "diode" in the second discharge transistor 722 is turned on, thereby discharging the negative charges in the signal line.

In some embodiments, the polysilicon resistors 71 include first polysilicon resistors 711. Two signal lines coupled to each of the first polysilicon resistors 711 are the high level line 641 and the test control line 631, respectively.

Referring to FIGS. 7 and 13, at least some of the polysilicon resistors 71 (the first polysilicon resistors 711) may be between and coupled to the high level line 641 (for transmitting the high level signal VGH) and the testing control line 631 (for transmitting the control signal from the testing unit 3). When a test (e.g., an ET test) is performed, an ON signal or an OFF signal as required is provided to the testing control line 631, and the first polysilicon resistor 711 is used to prevent the testing control line 631 from being influenced by the high level signal VGH. When a normal display is performed and no test is performed, an OFF signal of a fixed value may be applied to the testing control line 631, and the first polysilicon resistor 711 ensures the stability of the level of the OFF signal.

In some embodiments, the polysilicon resistors 71 include second polysilicon resistors 712. Two signal lines coupled to each of the second polysilicon resistors 712 are the high level line 641 and the signal line corresponding to the electrostatic discharge unit 72 respectively.

Referring to FIGS. 13 and 16, at least some of the polysilicon resistors 71 (the second polysilicon resistors 712) may be between and coupled to the high level line 641 (for transmitting the high level signal VGH) and the signal line (the testing signal line 63 or the multiplexing control line 621) corresponding to the electrostatic discharge unit 72 to avoid an excessively high level.

Of course, it should be understood that, since different electrostatic discharge units 72 correspond to different signal lines, different electrostatic discharge units 72 should also be coupled to different second polysilicon resistors 712, i.e., the number of second polysilicon resistors 712 may be the same as the number of electrostatic discharge units 72. However, in FIG. 13, only some of the second polysilicon resistors 712 are shown for clarity of connection.

In some embodiments, at least some of different data lines 11 are coupled to different number of sub-pixels 1.

Except for the data line 11 coupled to the largest number of sub-pixels 1, each of the remaining data lines 11 is coupled to one compensation capacitor unit 5.

Referring to FIGS. 1 and 2, in some cases, different data lines 11 are coupled to different numbers of sub-pixels 1. For example, when the display region 91 has a shape of a substantial circle and each of the data lines 11 is coupled to a column of sub-pixels 1, since different numbers of sub-pixels 1 are provided in different columns, different data lines 11 are coupled to different numbers of sub-pixels 1.

Obviously, each of the sub-pixels 1, as a pixel capacitor, has a certain capacitance, and the pixel capacitor is regarded as a "load" of the data line 11 coupled thereto. Therefore, the data lines 11 are coupled to different numbers of sub-pixels 1, resulting in different loads of different data lines 11. Thus, when a same signal is applied to the data lines 11, the signals actually obtained by the sub-pixels 1 coupled to different data lines 11 are different, which affects the display quality.

Therefore, except the data line 11 coupled to the largest number of sub-pixels 1 (i.e., the data line 11 with the largest load), the remaining data lines 11 each may be coupled to the compensation capacitor unit 5. The compensation capacitor unit 5 is used for "adding (or compensating)" a certain load to the data line 11, such that all the data lines 11 each have a total load (total capacitance) as close as possible, and a uniform display may be achieved.

In some embodiments, each of compensation capacitance units 5 includes one or more compensation capacitors 51.

Except for the data line 11 coupled to the largest number of sub-pixels 1, a number n of the compensation capacitors 51 in the compensation capacitor unit 5 coupled to the remaining data lines 11 satisfies:

$$N = N\mathrm{max} - N;$$

where Nmax is the number of sub-pixels 1 coupled to the data line 11 coupled to the largest number of sub-pixels 1, and N is the number of sub-pixels 1 coupled to the data line 11 coupled to the compensation capacitor unit 5.

Figure 17:
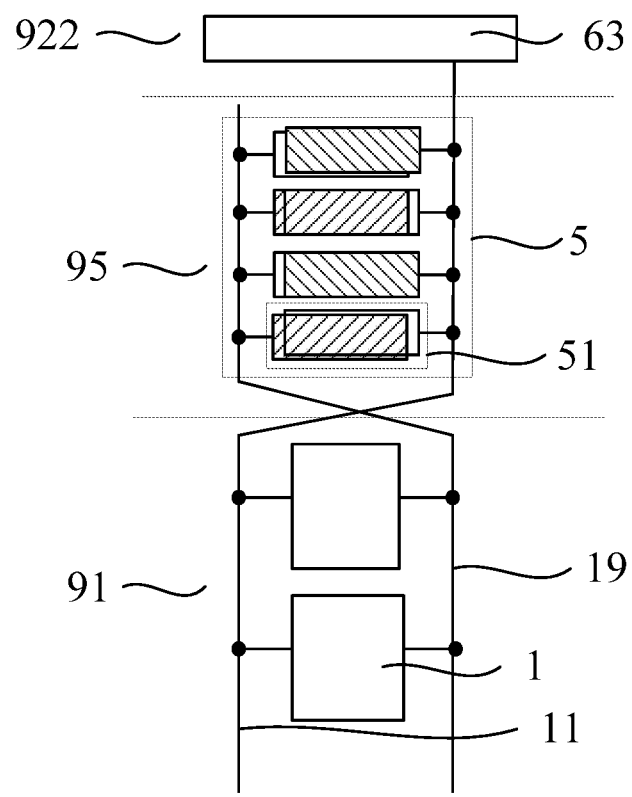
FIG. 17 is a schematic diagram illustrating a partial structure of a compensation capacitor unit of a display substrate according to an embodiment of the present disclosure.

Referring to FIG. 17, each of the compensation capacitor units 5 may include a plurality of compensation capacitors 51. A number of the compensation capacitors 51 is equal to the difference between the number (N) of sub-pixels 1 coupled to the data line 11 corresponding to the compensation capacitor unit 5 and the number Nmax of sub-pixels 1 coupled to the data line 11 coupled to the largest number of sub-pixels 1. In this way, as long as the capacitance of a single compensation capacitor 51 is substantially equal to the capacitance of a single sub-pixel 1, a total capacitance (total load) coupled to each of all the data lines 11 after being compensated may be substantially the same.

Generally, firstly, a plurality of actual sub-pixels 1 may be prepared and an actual capacitance of a single sub-pixel 1 is detected. Then, an actual size of the compensation capacitor 51 is determined based on the actual capacitance. Specifically, in order to reduce error, the total capacitance of a plurality of sub-pixels 1 (e.g., ten) is generally detected and divided by the number of sub-pixels 1 (e.g., ten) to obtain the capacitance of a single sub-pixel 1 (generally in a range from about 20~30 fF).

In some embodiments, the data line 11 is coupled to the first electrodes of all the compensation capacitors 51 in the compensation capacitor unit 5 coupled thereto.

The second electrodes of the compensation capacitors 51 each are coupled to a same constant level signal line.

Referring to FIG. 17, specifically, the data line 11 may be coupled to one electrode of each of the compensation capacitors 51 in the corresponding compensation capacitor unit 5, and the other electrode of each of all the compensation capacitors 51 may be coupled to a constant level signal line to obtain a same constant level. Exemplary, the other electrode of all the compensation capacitors 51 may be coupled to an anode signal line 19 for supplying power to an anode signal terminal VDD of the pixel circuit.

In some embodiments, the multiple sub-pixels 1 connected by each of the data lines 11 are arranged in a column along the first direction 991.

The compensation capacitor unit 5 coupled to each of the data lines 11 is provided between the column of sub-pixels 1 coupled to the data line 11 and the second sub-region 922 along the first direction 991.

Referring to FIG. 17, in a case where the sub-pixels 1 are arranged in multiple columns and each of the data lines 11 is coupled to one column of sub-pixels 1, a smaller number of sub-pixels 1 are in a "shorter" column, a larger number of compensation capacitors 51 are in the corresponding compensation capacitor unit 5, and a larger area is occupied by the compensation capacitor unit 5. Therefore, for sake of fully utilizing space, the compensation capacitance unit 5 may be provided between the sub-pixels 1 in a corresponding column and the second sub-region 922.

Of course, connection relationship, specific forms, position, etc., of the compensation capacitor units 5 described above are not intended to limit the scope of the embodiments of the present disclosure.

In a second aspect, a display device is provided in the embodiment of the present disclosure. The display device includes any one of the above display substrates.

The above display substrate may be combined with other components (e.g., a pair-box cover plate, a flexible wiring board, a driving chip, a power supply module, etc.) to form a display device having a display function.

In some embodiments, the display device is a wearable display device.

In particular, the above display device is particularly suitable as a wearable display device wearable on a human body, for example, the display device may be a smart watch or the like worn on a wrist of a person.

Of course, the wearable display device may further include a watch band or the like for wearing on the human body.

Of course, the above display device is not limited to a wearable display device, and may also be any product or component having a display function, such as electronic paper, a mobile phone, a tablet computer, a television, a display, a notebook computer, a digital photo frame, and a navigator.

The present disclosure has disclosed example embodiments, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. It will, therefore, be understood by those skilled in the art that various changes in form and details may be made therein without departing from the scope of the disclosure as set forth in the appended claims.

What is claimed is:

1. A display substrate, comprising a display region and a peripheral region, the peripheral region comprising a capacitor region, a circuit region, a fan-out region and a joint region, wherein
    the display region is provided with:
    a plurality of sub-pixels;
    a plurality of data lines extending along a first direction, each of the plurality of data lines being coupled to multiple sub-pixels; and
    a plurality of gate lines extending in a second direction intersecting the first direction, each of the plurality of gate lines being coupled to multiple sub-pixels,
    the circuit region is provided with a first sub-region and a second sub-region which are opposite to each other at two sides of the display region along the first direction, respectively,
    the first sub-region is provided with a plurality of multiplexing unit groups configured to provide data signals to the plurality of data lines, and each of the multiplexing unit groups comprises at least one multiplexing unit;
    the second sub-region is provided with a plurality of testing unit groups configured to provide testing signals to the plurality of data lines, and each of the plurality of testing unit groups comprises at least one testing unit;
    the circuit region is further provided with a plurality of driving unit groups, each of the driving unit groups comprises at least one driving unit; the driving unit groups and the multiplexing unit groups are alternately arranged in the first sub-region along an extending direction of the first sub-region, and the driving unit groups and the testing unit groups are alternately arranged in the second sub-region along an extending direction of the second sub-region;
    the capacitor region is between the second sub-region and the display region, and is provided with a plurality of compensation capacitor units, and each of the plurality of compensation capacitor units is coupled to one of the plurality of data lines,
    the joint region is on a side of the first sub-region distal to the display region and comprises a plurality of joints, at least some of the plurality of joints are coupled to signal lines, the signal lines comprise multiplexing signal lines coupled to multiplexing units, testing signal lines coupled to testing units and driving signal lines coupled to driving units; and
    the fan-out region is between the joint region and the first sub-region, and is provided with the multiplexing signal lines.

2. The display substrate of claim 1, wherein
the first sub-region comprises a first arc region, the second sub-region comprises a second arc region, and an edge of the first arc region proximal to the display region is closer to a center of the display region than an edge of the second arc region proximal to the display region.

3. The display substrate of claim 2, wherein
the first arc region has a same circle center as the second arc region, and a radius of the edge of the first arc region proximal to the display region is smaller than a radius of the edge of the second arc region proximal to the display region by 210 μm~420 μm.

4. The display substrate of claim 3, wherein
in the first sub-region, the multiplexing unit groups comprise first multiplexing unit groups and second multiplexing unit groups, each of the first multiplexing unit groups comprises M multiplexing units, each of the second multiplexing unit groups comprises N multiplexing units, N and M are integers each greater than 1, and M<N, the second multiplexing unit groups are in the middle of the first sub-region, the first multiplexing unit groups are at two ends of the first sub-region distal to the middle of the first sub-region; and/or
in the second sub-region, the testing unit groups comprise first testing unit groups and second testing unit groups, each of the first testing unit groups comprises K testing units, each of the second testing unit groups comprises L testing units, L and K are integers each greater than 1, and K<L, the second testing unit groups are in the middle of the second sub-region, and the first testing unit groups are at two ends of the second sub-region distal to the middle of the second sub-region.

5. The display substrate of claim 4, wherein
the circuit region is divided into a first half region and a second half region which are opposite to each other at two sides of the display region along the second direction;
the driving units comprise a plurality of gate driving units; and
the first half region is provided with multiple gate driving units configured to provide a gate driving signal to the plurality of gate lines.

6. The display substrate of claim 5, wherein
the display region is further provided with a plurality of control electrode lines extending along the second direction, and each of the plurality of control electrode line is coupled to multiple sub-pixels;
the driving units further comprises a plurality of control electrode driving units; and
the second half region is provided with a plurality of control electrode driving units configured to provide a control electrode driving signal to the plurality of control electrode lines.

7. The display substrate of claim 6, wherein
the multiplexing signal lines comprise a plurality of multiplexing control lines and a plurality of multiplexing data lines;
at least one of the multiplexing units includes a plurality of multiplexing transistors; a gate of each of the plurality of multiplexing transistors is coupled to one of the multiplexing control lines, a first electrode of each of the multiplexing transistors is coupled to one of the data lines, and a second electrode of each of the multiplexing transistors is coupled to one of the multiplexing data lines; and
second electrodes of all multiplexing transistors in a same multiplexing unit are coupled to a same multiplexing data line, and second electrodes of the multiplexing transistors in different multiplexing units are coupled to different multiplexing data lines.

8. The display substrate claim 7, wherein
the testing signal lines comprise testing control lines and testing data lines;
at least one of the testing units comprises a plurality of testing transistors; a gate of each of the plurality of testing transistors is coupled to one of the testing control lines, a first electrode of each of the plurality of testing transistors is coupled to one of the data lines, and a second electrode of each of the plurality of testing transistors is coupled to one of the testing data line; and
each of the testing data lines is coupled to multiple testing units.

9. The display substrate of claim 8, wherein
the testing signal lines are on a side of the circuit region distal to the display region; and
the driving signal lines are on a side of the circuit region distal to the display region.

10. The display substrate of claim 9, wherein
ends of the first sub-region closest to the second sub-region are closer to the display region than ends of the second sub-region closest to the first sub-region.

11. The display substrate of claim 10, wherein the circuit region further comprises:
connection sub-regions which are between and coupled to the ends of the first sub-region closest to the second sub-region and the ends of the second sub-region closest to the first sub-region.

12. The display substrate of claim 11, further comprising at least one polysilicon resistor, wherein
each of the at least one polysilicon resistor is between and coupled to two of the signal lines, the polysilicon resistor is on a side of the end of the first sub-region closest to the second sub-region, distal to the display region, or the polysilicon resistor is on a side of the connection sub-region distal to the display region.

13. The display substrate of claim 12, wherein
the testing signal lines are on a side of the circuit region distal to the display region;
the driving signal lines are on a side of the circuit region distal to the display region; and
the polysilicon resistor is on a side of the testing signal lines and the driving signal lines distal to the display region.

14. The display substrate of claim 11, further comprising at least one electrostatic discharge unit, wherein
each of the at least one electrostatic discharge unit is coupled to one of the signal lines and configured to release static charges in the signal line to which it is coupled; the electrostatic discharge unit is on a side of the end of the first sub-region closest to the second sub-region, distal to the display region, or the electrostatic discharge unit is on a side of the connection sub-region distal to the display region.

15. The display substrate of claim 14, wherein
the testing signal lines are on a side of the circuit region distal to the display region; the driving signal lines are on a side of the circuit region distal to the display region; and the electrostatic discharge units are on a side of the testing signal lines and the driving signal lines distal to the display region.

16. The display substrate of claim 14, wherein
the multiplexing signal lines comprise a plurality of multiplexing control lines and a plurality of multiplexing data lines; and
the signal lines coupled to each of electrostatic discharge units are the testing signal lines or the multiplexing control lines.

17. The display substrate of claim 14, wherein
the driving signal lines comprise a high level line and a low level line, the high level line is coupled to a high level signal source, and the low level line is coupled to a low level signal source; and
each of the electrostatic discharge units comprises a first discharge transistor and a second discharge transistor; a gate and a first electrode of the first discharge transistor are coupled to the high level line, and a second electrode of the first discharge transistor is coupled to the signal line corresponding to the electrostatic discharge unit; and a gate and a first electrode of the second discharge transistor are coupled to the signal line corresponding to the electrostatic discharge unit, and a second electrode of the second discharge transistor is coupled to the low level line.

18. The display substrate of claim 15, wherein
at least some of different data lines are coupled to different numbers of sub-pixels; and
except for the data line coupled to a largest number of sub-pixels, each of the remaining data lines is coupled to one of the compensation capacitor units.

19. The display substrate of claim 18, wherein
each of the compensation capacitor units comprises one or more compensation capacitors;
except for the data line coupled to the largest number of sub-pixels, the number n of the compensation capacitors in the compensation capacitor unit coupled to each of the remaining data lines, satisfies:

$$N = N\text{max} - N;$$

wherein Nmax is the number of the sub-pixels coupled to the data line coupled to the largest number of the sub-pixels, and N is the number of the sub-pixels coupled to the data line coupled to the compensation capacitor unit.

20. The display substrate of claim 19, wherein
the data line is coupled to first electrodes of all the compensation capacitors in the compensation capacitor unit coupled to the data line; and
second electrodes of all the compensation capacitors in the compensation capacitor unit are coupled to a same constant level signal line; or
wherein
multiple sub-pixels coupled to each of the data lines are arranged in a column along the first direction; and
the compensation capacitor unit coupled to each of the data lines is between a column of sub-pixels coupled to the data line and the second sub-region along the first direction.

* * * * *